(12) United States Patent
Cai et al.

(10) Patent No.: US 8,078,935 B2
(45) Date of Patent: Dec. 13, 2011

(54) METHOD AND SYSTEM FOR ENCODING AND DECODING INFORMATION WITH MODULATION CONSTRAINTS AND ERROR CONTROL

(75) Inventors: Kui Cai, Singapore (SG); Kees A. Schouhamer Immink, Rotterdam (NL)

(73) Assignee: Agency for Science, Technology and Research, Singapore (SG)

( * ) Notice: Subject to any disclaimer, the term of this patent is extended or adjusted under 35 U.S.C. 154(b) by 1183 days.

(21) Appl. No.: 11/796,094

(22) PCT Filed: Oct. 26, 2004

(86) PCT No.: PCT/SG2004/000357
§ 371 (c)(1),
(2), (4) Date: Apr. 25, 2007

(87) PCT Pub. No.: WO2006/046925
PCT Pub. Date: May 4, 2006

(65) Prior Publication Data
US 2008/0141095 A1    Jun. 12, 2008

(51) Int. Cl.
*H03M 13/00* (2006.01)
(52) U.S. Cl. ............................ 714/755; 714/800; 341/68
(58) Field of Classification Search .................. 714/755, 714/800; 341/68
See application file for complete search history.

(56) References Cited

U.S. PATENT DOCUMENTS
6,606,038 B2    8/2003  Immink et al.
(Continued)

FOREIGN PATENT DOCUMENTS
JP    2001189059 A    7/2001
(Continued)

OTHER PUBLICATIONS

T. Nakagawa, H. Ino, and Y. Shimpuku, "A simple detection method for RLL codes (Run detector)," IEEE Trans. Magnetics, vol. 33, No. 5, pp. 3262-3264, Sep. 1997.

(Continued)

*Primary Examiner* — Sam Rizk
(74) *Attorney, Agent, or Firm* — Weaver Austin Villeneuve & Sampson LLP

(57) ABSTRACT

A method and system for encoding a segment of user data words into a segment of code words so that both modulation constraints and a predetermined parity-check constraint are satisfied. Each segment of the user data is partitioned into several data words, and encoded separately by first and second types of component code, which are referred to as the normal constrained code and the parity-related constrained code, respectively. The parity-check constraint over the combined code word is achieved by concatenating the sequence of normal constrained code words with a specific parity-related constrained code word chosen from a candidate code word set. Both the component codes are finite-state constrained codes, which are designed to have rates close to the Shannon capacity. Furthermore, they are based on the same finite state machine (FSM), which enables them to be connected seamlessly, without violating the modulation constraints. Two preferred embodiments are provided to design a code in the non-return-to-zero inverted (NRZI) format and the non-return-to-zero (NRZ) format, respectively. Designing the codes in NRZ format may reduce the number of parity-check bits required for error detection and simplify error correction or post-processing. The parity-check constraint is defined by the parity-check polynomial or parity-check matrix of a systematic linear block code, which could detect any type of dominant error event as well as error event combinations of a given optical recording system. As a result, the information density of the system is improved.

81 Claims, 17 Drawing Sheets

U.S. PATENT DOCUMENTS

| | | | |
|---|---|---|---|
| 6,639,524 | B2 | 10/2003 | Immink |
| 2003/0028839 | A1 | 2/2003 | Coene et al. |
| 2003/0072242 | A1 | 4/2003 | Uchida et al. |
| 2005/0166130 | A1* | 7/2005 | Coene et al. ............ 714/800 |
| 2005/0171973 | A1* | 8/2005 | Coene ............ 707/104.1 |

FOREIGN PATENT DOCUMENTS

| | | |
|---|---|---|
| JP | 2003-123400 A | 4/2003 |
| JP | 2004-532561 A | 10/2004 |
| WO | 02/080373 | 10/2002 |

OTHER PUBLICATIONS

T. Narahara, S. Kobayashi, Y. Shimpuku, G. van den Enden, J. Kahlman, M. van Dijk, and R. van Woudenburg, "Optical disc system for digital video recording," Jpn. J. Appl. Phys., pt. 1, vol. 39, No. 2B, pp. 912-919, 2000.

P. Perry, M.C. Lin, and Z. Zhang, "Runlength-Limited Codes for Single Error-Detection and Single Error-Correction with Mixed Type Errors, "IEEE Trans. Inform. Theory, vol. 44, No. 4, pp. 1588-1592, Jul. 1998.

L.L. McPheters and S.W. McLaughlin, "Turbo-coded optical recording channels with DVD minimum mark size," IEEE Trans. Magnetics, vol. 38, No. 1, pp. 298-302, Jan. 2002.

H. Song, B.V.K. Vijaya Kumar, E. Kurtas, Y. Yuan, L.L. Mc Pheters, and S.W. McLaughlin, "Iterative decoding for partial response (PR) equalized magneto-optical (MO) data storage channels," IEEE, Journal of Selected Area on Communications, vol. 19, pp. 774-883, 2001.

A. Patapoutian, B.Z. Shen, and P.A. McEwen, "Event Error Control Codes and Their Applications," IEEE Trans. Inform. Theory, vol. 47, No. 6, pp. 2595-2603, Sep. 2001.

K.A.S. Immink, J.K. Kim, and S.W. Suh, "Efficient Dc-free RLL codes for Optical Recording," IEEE Trans. Commun., vol. 51, pp. 326-331, Mar. 2003.

S. Gopalaswamy and J.W.M. Bergmans, "Modified target and concatenated Coding for constrained magnetic recording channels," in Proc. IEEE Intl. Conf. Commun. (ICC), New Orleans, USA, Jun. 2000, pp. 89-93.

H. Sawaguchi, S. Mita, and J.K. Wolf, "A concatenated coding technique for partial response channels," IEEE Trans. Magnetics, vol. 37, No. 2, pp. 695-703, Mar. 2001.

W. Coene, H. Pozidis, J. Bergmans, "Run-length limited parity-check coding for transition-shift errors in optical recording," in Proc. IEEE Intl. Conf. Global Telecommun. (GLOBECOM), San Antonio, Nov. 2001, pp. 2982-2986.

K. Cai, V.Y. Krachkovsky, and J.W.M. Bergmans, "Performance bounds for parity coded optical recoding channels with d=1 constraint," Proc. of IEEE International Conference on Communications (ICC), Alaska, USA, May 2003.

Japanese Office Action dated Aug. 2, 2011, from Application No. 2007-538867.

Japanese Office Action dated Oct. 26, 2010, from Application No. 2007-538867.

Korean Office action dated Feb. 18, 2011, from Application No. 10-2007-7011934.

* cited by examiner

FIGURE 4

| Data word | Even parity | | | | | | Odd parity | | | | | |
|---|---|---|---|---|---|---|---|---|---|---|---|---|
| 0 | 00000 1 | 01010 1 | 00101 1 | 10010 1 | 10100 1 | 00010 1 | 00100 1 | 01000 1 | 10000 1 | 01000 1 | 10000 1 | 10101 1 |
| 1 | 00000 2 | 01010 2 | 00101 2 | 10010 2 | 10100 2 | 00010 2 | 00100 2 | 01000 2 | 10000 2 | 01000 2 | 10000 2 | 10101 2 |
| 2 | 00000 3 | 01010 3 | 00101 3 | 10010 3 | 10100 3 | 00010 3 | 00100 3 | 01000 3 | 10000 3 | 01000 3 | 10000 3 | 10101 3 |
| 3 | 00000 4 | 01010 4 | 01001 4 | 10010 4 | 10100 4 | 00010 4 | 00100 4 | 01000 4 | 10000 4 | 01000 4 | 10000 4 | 00001 1 |

Candidate code words and following states

FIGURE 5

| Parity-check of the normal constrained coded sequence | Following state associated with the previous code word | Current code word | Following state associated with the current code word |
|---|---|---|---|
| Even | 1 | 00000 | 4 |
| Even | 2 | 01010 | 4 |
| Even | 3 | 01001 | 1 |
| Even | 4 | 10010 | 4 |
| Even | 5 | 10100 | 4 |
| Odd | 1 | 00010 | 4 |
| Odd | 2 | 00100 | 4 |
| Odd | 3 | 01000 | 4 |
| Odd | 4 | 10000 | 4 |
| Odd | 5 | 00001 | 1 |

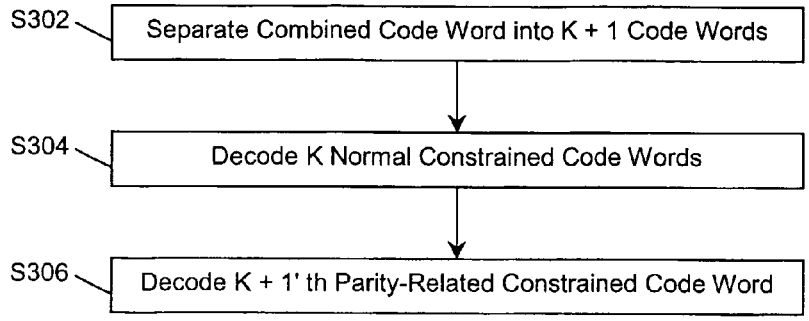

FIGURE 7

| | Parity (even; odd) | | | |
|---|---|---|---|---|
| | $\check{C}_{00}$ | $\check{C}_{01}$ | $\check{C}_{10}$ | $\check{C}_{11}$ |
| Total | 2135 | 1275 | 1275 | 805 |
| $S_1$ | 605 | 358 | 0 | 0 |
| $S_2$ | 599 | 369 | 0 | 0 |
| $S_3$ | 603 | 362 | 0 | 0 |
| $S_4$ | 0 | 0 | 589 | 384 |
| $S_5$ | 0 | 0 | 600 | 368 |

| | Parity (odd; even) | | | |
|---|---|---|---|---|
| | $\check{C}_{00}$ | $\check{C}_{01}$ | $\check{C}_{10}$ | $\check{C}_{11}$ |
| Total | 2046 | 1309 | 1309 | 792 |
| $S_1$ | 589 | 384 | 0 | 0 |
| $S_2$ | 599 | 368 | 0 | 0 |
| $S_3$ | 594 | 378 | 0 | 0 |
| $S_4$ | 0 | 0 | 605 | 357 |
| $S_5$ | 0 | 0 | 598 | 370 |

FIGURE 9

| | Parity (even; even) | | | | | | | | |
|---|---|---|---|---|---|---|---|---|---|
| | $\check{C}_{0000}$ | $\check{C}_{0010}$ | $\check{C}_{0001}$ | $\check{C}_{1000}$ | $\check{C}_{1010}$ | $\check{C}_{1001}$ | $\check{C}_{0100}$ | $\check{C}_{0110}$ | $\check{C}_{0101}$ |
| Total | 299 | 139 | 203 | 204 | 95 | 138 | 138 | 65 | 93 |
| $S_1$ | 70 | 32 | 51 | 0 | 0 | 0 | 0 | 0 | 0 |
| $S_2$ | 71 | 33 | 48 | 0 | 0 | 0 | 0 | 0 | 0 |
| $S_3$ | 71 | 34 | 46 | 0 | 0 | 0 | 0 | 0 | 0 |
| $S_4$ | 72 | 32 | 48 | 0 | 0 | 0 | 0 | 0 | 0 |
| $S_5$ | 0 | 1 | 0 | 70 | 31 | 51 | 0 | 0 | 0 |
| $S_6$ | 0 | 0 | 0 | 71 | 33 | 47 | 0 | 0 | 0 |
| $S_7$ | 8 | 3 | 6 | 63 | 31 | 40 | 0 | 0 | 0 |
| $S_8$ | 0 | 0 | 1 | 0 | 0 | 0 | 71 | 34 | 45 |
| $S_9$ | 3 | 2 | 2 | 0 | 0 | 0 | 67 | 31 | 48 |

| | Parity (odd; odd) | | | | | | | | |
|---|---|---|---|---|---|---|---|---|---|
| | $\check{C}_{0000}$ | $\check{C}_{0010}$ | $\check{C}_{0001}$ | $\check{C}_{1000}$ | $\check{C}_{1010}$ | $\check{C}_{1001}$ | $\check{C}_{0100}$ | $\check{C}_{0110}$ | $\check{C}_{0101}$ |
| Total | 296 | 138 | 203 | 202 | 94 | 139 | 139 | 64 | 96 |
| $S_1$ | 71 | 34 | 46 | 0 | 0 | 0 | 0 | 0 | 0 |
| $S_2$ | 70 | 33 | 49 | 0 | 0 | 0 | 0 | 0 | 0 |
| $S_3$ | 71 | 31 | 50 | 0 | 0 | 0 | 0 | 0 | 0 |
| $S_4$ | 70 | 34 | 48 | 0 | 0 | 0 | 0 | 0 | 0 |
| $S_5$ | 0 | 1 | 0 | 71 | 34 | 45 | 0 | 0 | 0 |
| $S_6$ | 0 | 0 | 0 | 70 | 33 | 49 | 0 | 0 | 0 |
| $S_7$ | 10 | 4 | 6 | 61 | 27 | 45 | 0 | 0 | 0 |
| $S_8$ | 1 | 0 | 0 | 0 | 0 | 0 | 70 | 31 | 51 |
| $S_9$ | 2 | 1 | 2 | 0 | 0 | 0 | 69 | 33 | 45 |

FIGURE 13

| Data word | Candidate code words and following states | | | | | | | | | | | | | | | |
|---|---|---|---|---|---|---|---|---|---|---|---|---|---|---|---|---|
| | Parity (even; odd) | | | | Parity (even; odd) | | | | | | | Parity (odd; even) | | | | |
| 0 | 2 | 1 | 35136 | 3 | 84098 | 2 | 262145 | 1 | 346642 | 1 | 4 | 1 | 35497 | 3 | 164176 | 1 | 297257 | 1 |
| 1 | 2 | 2 | 35136 | 4 | 84098 | 3 | 262145 | 2 | 297641 | 1 | 4 | 2 | 36864 | 1 | 84498 | 1 | 297257 | 2 |
| 2 | 2 | 3 | 35136 | 5 | 84098 | 4 | 262145 | 3 | 297641 | 2 | 4 | 3 | 36864 | 2 | 84498 | 2 | 297257 | 3 |
| 3 | 2 | 4 | 35138 | 1 | 84098 | 5 | 262148 | 1 | 297641 | 3 | 4 | 4 | 36864 | 3 | 84498 | 3 | 297280 | 1 |
| 4 | 2 | 5 | 35138 | 2 | 84101 | 1 | 262148 | 2 | 299008 | 1 | 4 | 5 | 36864 | 4 | 84498 | 4 | 297280 | 2 |
| 5 | 5 | 1 | 35138 | 3 | 84101 | 2 | 262148 | 3 | 299008 | 2 | 9 | 1 | 36864 | 5 | 84498 | 5 | 297280 | 3 |
| 6 | 5 | 2 | 35138 | 4 | 84101 | 3 | 262148 | 4 | 299008 | 3 | 9 | 2 | 36866 | 1 | 84501 | 1 | 297280 | 4 |
| 7 | 5 | 3 | 35138 | 5 | 84104 | 1 | 262148 | 5 | 299008 | 4 | 9 | 3 | 36866 | 2 | 84501 | 2 | 297280 | 5 |
| 8 | 8 | 1 | 35141 | 1 | 84104 | 2 | 262153 | 1 | 299008 | 5 | 16 | 1 | 36866 | 3 | 84501 | 3 | 297282 | 1 |
| 9 | 8 | 2 | 35141 | 2 | 84104 | 3 | 262153 | 2 | 299010 | 1 | 16 | 2 | 36866 | 4 | 84513 | 1 | 297282 | 2 |
| 10 | 8 | 3 | 35141 | 3 | 84104 | 4 | 262153 | 3 | 299010 | 2 | 16 | 3 | 36866 | 5 | 84513 | 2 | 297282 | 3 |
| 11 | 8 | 4 | 35144 | 1 | 84104 | 5 | 262160 | 1 | 299010 | 3 | 16 | 4 | 36869 | 1 | 84513 | 3 | 297282 | 4 |
| 12 | 8 | 5 | 35144 | 2 | 84106 | 1 | 262160 | 2 | 299010 | 4 | 16 | 5 | 36869 | 2 | 84516 | 1 | 297282 | 5 |
| 13 | 10 | 1 | 35144 | 3 | 84106 | 2 | 262160 | 3 | 299013 | 1 | 18 | 1 | 36872 | 1 | 84516 | 2 | 297285 | 1 |
| 14 | 10 | 2 | 35144 | 4 | 84106 | 3 | 262160 | 4 | 299013 | 2 | 18 | 2 | 36872 | 2 | 84516 | 3 | 297285 | 2 |
| 15 | 10 | 3 | 35144 | 5 | 84106 | 4 | 262160 | 5 | 299013 | 3 | 18 | 3 | 36872 | 3 | 84516 | 4 | 297285 | 3 |
| 16 | 10 | 4 | 35146 | 1 | 84106 | 5 | 262162 | 1 | 299016 | 1 | 18 | 4 | 36872 | 4 | 84516 | 5 | 297288 | 1 |
| 17 | 10 | 5 | 35146 | 2 | 84113 | 1 | 262162 | 2 | 299016 | 2 | 18 | 5 | 36872 | 5 | 84521 | 1 | 297288 | 2 |
| 18 | 17 | 1 | 35146 | 3 | 84113 | 2 | 262162 | 3 | 299016 | 3 | 21 | 1 | 36874 | 1 | 84521 | 2 | 297288 | 3 |
| 19 | 17 | 2 | 35146 | 4 | 84113 | 3 | 262162 | 4 | 299016 | 4 | 21 | 2 | 36874 | 2 | 84544 | 3 | 297288 | 4 |
| 20 | 17 | 3 | 35146 | 5 | 84116 | 1 | 262162 | 5 | 299016 | 5 | 21 | 3 | 36874 | ... | ... | ... | 297288 | 5 |
| ... | ... | ... | ... | ... | ... | ... | ... | ... | ... | ... | ... | ... | ... | ... | ... | ... | ... | ... |

FIGURE 10

| Parity-check bits ([0 0 0 0]; [1 1 0 0]) | | | | |
|---|---|---|---|---|
| | $c_{00}$ | $c_{01}$ | $c_{10}$ | $c_{11}$ |
| Total | 67 | 42 | 39 | 22 |
| $S_1$ | 19 | 11 | 0 | 0 |
| $S_2$ | 18 | 13 | 0 | 0 |
| $S_3$ | 19 | 13 | 0 | 0 |
| $S_4$ | 0 | 0 | 19 | 11 |
| $S_5$ | 0 | 0 | 19 | 11 |

| Parity-check bits ([0 0 0 1]; [1 1 0 1]) | | | | |
|---|---|---|---|---|
| | $c_{00}$ | $c_{01}$ | $c_{10}$ | $c_{11}$ |
| Total | 58 | 45 | 39 | 20 |
| $S_1$ | 17 | 15 | 0 | 0 |
| $S_2$ | 19 | 12 | 0 | 0 |
| $S_3$ | 18 | 15 | 0 | 0 |
| $S_4$ | 0 | 0 | 20 | 10 |
| $S_5$ | 0 | 1 | 19 | 10 |

| Parity-check bits ([0 0 1 0]; [1 1 1 0]) | | | | |
|---|---|---|---|---|
| | $c_{00}$ | $c_{01}$ | $c_{10}$ | $c_{11}$ |
| Total | 64 | 34 | 37 | 24 |
| $S_1$ | 19 | 11 | 0 | 0 |
| $S_2$ | 21 | 9 | 0 | 0 |
| $S_3$ | 19 | 12 | 0 | 0 |
| $S_4$ | 1 | 0 | 18 | 12 |
| $S_5$ | 0 | 0 | 19 | 12 |

| Parity-check bits ([0 0 1 1]; [1 1 1 1]) | | | | |
|---|---|---|---|---|
| | $c_{00}$ | $c_{01}$ | $c_{10}$ | $c_{11}$ |
| Total | 63 | 35 | 35 | 27 |
| $S_1$ | 20 | 10 | 0 | 0 |
| $S_2$ | 19 | 12 | 0 | 0 |
| $S_3$ | 20 | 10 | 0 | 0 |
| $S_4$ | 1 | 0 | 18 | 12 |
| $S_5$ | 0 | 0 | 17 | 15 |

| Parity-check bits ([0 1 0 0]; [1 0 0 0]) | | | | |
|---|---|---|---|---|
| | $c_{00}$ | $c_{01}$ | $c_{10}$ | $c_{11}$ |
| Total | 58 | 36 | 38 | 25 |
| $S_1$ | 18 | 13 | 0 | 0 |
| $S_2$ | 20 | 11 | 0 | 0 |
| $S_3$ | 20 | 12 | 0 | 0 |
| $S_4$ | 0 | 0 | 19 | 11 |
| $S_5$ | 0 | 0 | 18 | 13 |

| Parity-check bits ([0 1 0 1]; [1 0 0 1]) | | | | |
|---|---|---|---|---|
| | $c_{00}$ | $c_{01}$ | $c_{10}$ | $c_{11}$ |
| Total | 64 | 36 | 37 | 25 |
| $S_1$ | 19 | 12 | 0 | 0 |
| $S_2$ | 21 | 9 | 0 | 0 |
| $S_3$ | 19 | 12 | 0 | 0 |
| $S_4$ | 0 | 0 | 19 | 11 |
| $S_5$ | 0 | 0 | 18 | 14 |

| Parity-check bits ([0 1 1 0]; [1 0 1 0]) | | | | |
|---|---|---|---|---|
| | $c_{00}$ | $c_{01}$ | $c_{10}$ | $c_{11}$ |
| Total | 60 | 41 | 39 | 23 |
| $S_1$ | 18 | 14 | 0 | 0 |
| $S_2$ | 20 | 11 | 0 | 0 |
| $S_3$ | 18 | 14 | 0 | 0 |
| $S_4$ | 0 | 0 | 19 | 11 |
| $S_5$ | 0 | 0 | 19 | 11 |

| Parity-check bits ([0 1 1 1]; [1 0 1 1]) | | | | |
|---|---|---|---|---|
| | $c_{00}$ | $c_{01}$ | $c_{10}$ | $c_{11}$ |
| Total | 61 | 37 | 40 | 22 |
| $S_1$ | 20 | 10 | 0 | 0 |
| $S_2$ | 18 | 13 | 0 | 0 |
| $S_3$ | 20 | 11 | 0 | 0 |
| $S_4$ | 0 | 1 | 18 | 12 |
| $S_5$ | 0 | 0 | 20 | 10 |

FIGURE 11A

| Parity-check bits ([1 0 0 0]; [0 1 0 0]) | | | | |
|---|---|---|---|---|
| | $C_{00}$ | $C_{01}$ | $C_{10}$ | $C_{11}$ |
| Total | 60 | 39 | 36 | 22 |
| $S_1$ | 18 | 13 | 0 | 0 |
| $S_2$ | 19 | 12 | 0 | 0 |
| $S_3$ | 19 | 12 | 0 | 0 |
| $S_4$ | 1 | 0 | 18 | 12 |
| $S_5$ | 2 | 0 | 18 | 10 |

| Parity-check bits ([1 0 0 1]; [0 1 0 1]) | | | | |
|---|---|---|---|---|
| | $C_{00}$ | $C_{01}$ | $C_{10}$ | $C_{11}$ |
| Total | 60 | 39 | 39 | 21 |
| $S_1$ | 20 | 10 | 0 | 0 |
| $S_2$ | 18 | 14 | 0 | 0 |
| $S_3$ | 19 | 11 | 0 | 0 |
| $S_4$ | 0 | 0 | 19 | 11 |
| $S_5$ | 0 | 0 | 20 | 10 |

| Parity-check bits ([1 0 1 0]; [0 1 1 0]) | | | | |
|---|---|---|---|---|
| | $C_{00}$ | $C_{01}$ | $C_{10}$ | $C_{11}$ |
| Total | 62 | 38 | 37 | 25 |
| $S_1$ | 19 | 11 | 0 | 0 |
| $S_2$ | 19 | 11 | 0 | 0 |
| $S_3$ | 19 | 11 | 0 | 0 |
| $S_4$ | 0 | 1 | 17 | 14 |
| $S_5$ | 0 | 0 | 20 | 11 |

| Parity-check bits ([1 0 1 1]; [0 1 1 1]) | | | | |
|---|---|---|---|---|
| | $C_{00}$ | $C_{01}$ | $C_{10}$ | $C_{11}$ |
| Total | 63 | 35 | 37 | 24 |
| $S_1$ | 18 | 13 | 0 | 0 |
| $S_2$ | 20 | 10 | 0 | 0 |
| $S_3$ | 19 | 11 | 0 | 0 |
| $S_4$ | 0 | 0 | 19 | 11 |
| $S_5$ | 0 | 0 | 18 | 13 |

| Parity-check bits ([1 1 0 0]; [0 0 0 0]) | | | | |
|---|---|---|---|---|
| | $C_{00}$ | $C_{01}$ | $C_{10}$ | $C_{11}$ |
| Total | 63 | 36 | 41 | 27 |
| $S_1$ | 20 | 10 | 0 | 0 |
| $S_2$ | 19 | 11 | 0 | 0 |
| $S_3$ | 19 | 11 | 0 | 0 |
| $S_4$ | 0 | 0 | 19 | 11 |
| $S_5$ | 0 | 0 | 19 | 12 |

| Parity-check bits ([1 1 0 1]; [0 0 0 1]) | | | | |
|---|---|---|---|---|
| | $C_{00}$ | $C_{01}$ | $C_{10}$ | $C_{11}$ |
| Total | 65 | 33 | 37 | 27 |
| $S_1$ | 19 | 11 | 0 | 0 |
| $S_2$ | 20 | 10 | 0 | 0 |
| $S_3$ | 20 | 11 | 0 | 0 |
| $S_4$ | 0 | 1 | 17 | 14 |
| $S_5$ | 0 | 0 | 19 | 12 |

| Parity-check bits ([1 1 1 0]; [0 0 1 0]) | | | | |
|---|---|---|---|---|
| | $C_{00}$ | $C_{01}$ | $C_{10}$ | $C_{11}$ |
| Total | 61 | 40 | 39 | 21 |
| $S_1$ | 19 | 12 | 0 | 0 |
| $S_2$ | 19 | 12 | 0 | 0 |
| $S_3$ | 18 | 13 | 0 | 0 |
| $S_4$ | 0 | 0 | 19 | 11 |
| $S_5$ | 0 | 0 | 20 | 10 |

| Parity-check bits ([1 1 1 1]; [0 0 1 1]) | | | | |
|---|---|---|---|---|
| | $C_{00}$ | $C_{01}$ | $C_{10}$ | $C_{11}$ |
| Total | 58 | 44 | 40 | 22 |
| $S_1$ | 17 | 15 | 0 | 0 |
| $S_2$ | 18 | 13 | 0 | 0 |
| $S_3$ | 18 | 14 | 0 | 0 |
| $S_4$ | 0 | 0 | 20 | 10 |
| $S_5$ | 0 | 0 | 19 | 12 |

FIGURE 11B

| Data | Candidate code words and following states | | | | | | | | | | | | | | | | |
|---|---|---|---|---|---|---|---|---|---|---|---|---|---|---|---|---|---|
| word | Parity-check bits ([0 0 0 0]; [1 1 0 0]) | | | | | | | | Parity-check bits ([0 0 0 1]; [1 1 0 1]) | | | | | | | | |
| 0 | 21 | 1 | 4737 | 1 | 20737 | 1 | 32769 | 1 | 37444 | 1 | 64 | 1 | 4777 | 2 | 21122 | 1 | 32770 | 1 | 21161 | 1 |
| 1 | 21 | 2 | 4737 | 2 | 10505 | 1 | 32769 | 2 | 37444 | 2 | 64 | 2 | 4777 | 3 | 21122 | 2 | 32770 | 2 | 21161 | 2 |
| 2 | 21 | 3 | 4737 | 3 | 10505 | 2 | 32769 | 3 | 37444 | 3 | 64 | 3 | 5130 | 1 | 10913 | 1 | 32770 | 3 | 37205 | 1 |
| 3 | 146 | 1 | 4756 | 1 | 10505 | 3 | 32788 | 1 | 37444 | 4 | 64 | 4 | 5130 | 2 | 10913 | 2 | 32770 | 4 | 37205 | 2 |
| 4 | 146 | 2 | 4756 | 2 | 10530 | 1 | 32788 | 2 | 37444 | 5 | 64 | 5 | 5130 | 3 | 10913 | 3 | 32770 | 5 | 37205 | 3 |
| 5 | 146 | 3 | 4756 | 3 | 10530 | 2 | 32788 | 3 | 37457 | 1 | 85 | 1 | 5130 | 4 | 16424 | 1 | 32809 | 1 | 37380 | 1 |
| 6 | 146 | 4 | 4756 | 4 | 10530 | 3 | 32788 | 4 | 37457 | 2 | 85 | 2 | 5130 | 5 | 16424 | 2 | 32809 | 2 | 37380 | 2 |
| 7 | 146 | 5 | 4756 | 5 | 10530 | 4 | 32788 | 5 | 37457 | 3 | 85 | 3 | 5153 | 1 | 16424 | 3 | 32809 | 3 | 37380 | 3 |
| 8 | 293 | 1 | 4778 | 1 | 10530 | 5 | 32810 | 1 | 37504 | 1 | 132 | 1 | 5153 | 2 | 16424 | 4 | 32833 | 1 | 37380 | 4 |
| 9 | 293 | 2 | 4778 | 2 | 10570 | 1 | 32810 | 2 | 37504 | 2 | 132 | 2 | 5153 | 3 | 16424 | 5 | 32833 | 2 | 37380 | 5 |
| 10 | 293 | 3 | 4778 | 3 | 10570 | 2 | 32810 | 3 | 37504 | 3 | 132 | 3 | 5193 | 1 | 16448 | 1 | 32833 | 3 | 37393 | 1 |
| 11 | 521 | 1 | 4778 | 4 | 10570 | 3 | 32810 | 4 | 37504 | 4 | 132 | 4 | 5193 | 2 | 16448 | 2 | 32852 | 1 | 37393 | 2 |
| 12 | 521 | 2 | 4778 | 5 | 10570 | 4 | 32810 | 5 | 37504 | 5 | 132 | 5 | 5193 | 3 | 16448 | 3 | 32852 | 2 | 37393 | 3 |
| 13 | 521 | 3 | 5129 | 1 | 10570 | 5 | 32834 | 1 | 37525 | 1 | 145 | 1 | 5380 | 1 | 16448 | 4 | 32852 | 3 | 37458 | 1 |
| 14 | 546 | 1 | 5129 | 2 | 10789 | 1 | 32834 | 2 | 37525 | 2 | 145 | 2 | 5380 | 2 | 16448 | 5 | 32852 | 4 | 37458 | 2 |
| 15 | 546 | 2 | 5129 | 3 | 10789 | 2 | 32834 | 3 | 37525 | 3 | 145 | 3 | 5380 | 3 | 16469 | 1 | 32852 | 5 | 37458 | 3 |
| 16 | 546 | 3 | 5154 | 1 | 10789 | 3 | 32834 | 4 | 37896 | 1 | 522 | 1 | 5380 | 4 | 16469 | 2 | 32901 | 1 | 37458 | 4 |
| 17 | 546 | 4 | 5154 | 2 | 10889 | 1 | 32834 | 5 | 37896 | 2 | 522 | 2 | 5380 | 5 | 16469 | 3 | 32901 | 2 | 37458 | 5 |
| 18 | 546 | 5 | 5154 | 3 | 10889 | 2 | 33060 | 1 | 37896 | 3 | 522 | 3 | 5393 | 1 | 16516 | 1 | 32901 | 3 | 37544 | 1 |
| 19 | 586 | 1 | 5154 | 4 | 10889 | 3 | 33060 | 2 | 37896 | 4 | 522 | 4 | 5393 | 2 | 16516 | 2 | 32912 | 1 | 37544 | 2 |
| 20 | 586 | 2 | 5154 | 5 | 10914 | 1 | 33060 | 3 | 37896 | 5 | 522 | 5 | 5393 | 3 | 16516 | 3 | 32912 | 2 | 37544 | 3 |
| ... | ... | ... | ... | ... | ... | ... | ... | ... | ... | ... | ... | ... | ... | ... | ... | ... | ... | ... | ... | ... |

FIGURE 12A

| Candidate code words and following states | | | | | | | | | | | | | | | | | | | |
|---|---|---|---|---|---|---|---|---|---|---|---|---|---|---|---|---|---|---|---|
| Parity-check bits ([1 1 1 0]; [0 0 1 0]) | | | | | | | | | Parity-check bits ([1 1 1 1]; [0 0 1 1]) | | | | | | | | | |
| 68 | 1 | 4609 | 3 | 21034 | 1 | 32837 | 1 | 37397 | 1 | 17 | 1 | 4692 | 2 | 16401 | 1 | 32773 | 1 | 43552 | 1 |
| 68 | 2 | 4628 | 1 | 16452 | 1 | 32837 | 2 | 37397 | 2 | 17 | 2 | 4692 | 3 | 16401 | 2 | 32773 | 2 | 43552 | 2 |
| 68 | 3 | 4628 | 2 | 16452 | 2 | 32837 | 3 | 37397 | 3 | 17 | 3 | 4692 | 4 | 16401 | 3 | 32773 | 3 | 37521 | 1 |
| 68 | 4 | 4628 | 3 | 16452 | 3 | 32848 | 1 | 37522 | 1 | 82 | 1 | 4692 | 5 | 16466 | 1 | 32784 | 1 | 37521 | 2 |
| 68 | 5 | 4628 | 4 | 16452 | 4 | 32848 | 2 | 37522 | 2 | 82 | 2 | 4741 | 1 | 16466 | 2 | 32784 | 2 | 37521 | 3 |
| 81 | 1 | 4628 | 5 | 16452 | 5 | 32848 | 3 | 37522 | 3 | 82 | 3 | 4741 | 2 | 16466 | 3 | 32784 | 3 | 38048 | 1 |
| 81 | 2 | 4650 | 1 | 16465 | 1 | 32848 | 4 | 37522 | 4 | 82 | 4 | 4741 | 3 | 16466 | 4 | 32784 | 4 | 38048 | 2 |
| 81 | 3 | 4650 | 2 | 16465 | 2 | 32848 | 5 | 37522 | 5 | 82 | 5 | 4752 | 1 | 16466 | 5 | 32784 | 5 | 38048 | 3 |
| 128 | 1 | 4650 | 3 | 16465 | 3 | 32897 | 1 | 37924 | 1 | 168 | 1 | 4752 | 2 | 16552 | 1 | 32898 | 1 | 38048 | 4 |
| 128 | 2 | 4650 | 4 | 16512 | 1 | 32897 | 2 | 37924 | 2 | 168 | 2 | 4752 | 3 | 16552 | 2 | 32898 | 2 | 38048 | 5 |
| 128 | 3 | 4650 | 5 | 16512 | 2 | 32897 | 3 | 37924 | 3 | 168 | 3 | 4752 | 4 | 16552 | 3 | 32898 | 3 | 38146 | 1 |
| 128 | 4 | 4674 | 1 | 16512 | 3 | 32916 | 1 | 37924 | 4 | 168 | 4 | 4752 | 5 | 16552 | 4 | 32898 | 4 | 38146 | 2 |
| 128 | 5 | 4674 | 2 | 16512 | 4 | 32916 | 2 | 37924 | 5 | 168 | 5 | 5258 | 1 | 16552 | 5 | 32898 | 5 | 38146 | 3 |
| 149 | 1 | 4674 | 3 | 16512 | 5 | 32916 | 3 | 38024 | 1 | 266 | 1 | 5258 | 2 | 16650 | 1 | 32937 | 1 | 38146 | 4 |
| 149 | 2 | 4674 | 4 | 16533 | 1 | 32916 | 4 | 38024 | 2 | 266 | 2 | 5258 | 3 | 16650 | 2 | 32937 | 2 | 38146 | 5 |
| 149 | 3 | 4674 | 5 | 16533 | 2 | 32916 | 5 | 38024 | 3 | 266 | 3 | 5258 | 4 | 16650 | 3 | 32937 | 3 | 38185 | 1 |
| 265 | 1 | 5157 | 1 | 16533 | 3 | 32938 | 1 | 38024 | 4 | 266 | 4 | 5258 | 5 | 16650 | 4 | 33056 | 1 | 38185 | 2 |
| 265 | 2 | 5157 | 2 | 16649 | 1 | 32938 | 2 | 38024 | 5 | 266 | 5 | 5281 | 1 | 16650 | 5 | 33056 | 2 | 38185 | 3 |
| 265 | 3 | 5157 | 3 | 16649 | 2 | 32938 | 3 | 38145 | 1 | 289 | 1 | 5281 | 2 | 16673 | 1 | 33056 | 3 | 38209 | 1 |
| 290 | 1 | 5257 | 1 | 16649 | 3 | 32938 | 4 | 38145 | 2 | 289 | 2 | 5281 | 3 | 16673 | 2 | 33056 | 4 | 38209 | 2 |
| 290 | 2 | 5257 | 2 | 16674 | 1 | 32938 | 5 | 38145 | 3 | 289 | 3 | 5416 | 1 | 16673 | 3 | 33056 | 5 | 38209 | 3 |
| ... | ... | ... | ... | ... | ... | ... | ... | ... | ... | ... | ... | ... | ... | ... | ... | ... | ... | ... | ... |

METHOD AND SYSTEM FOR ENCODING AND DECODING INFORMATION WITH MODULATION CONSTRAINTS AND ERROR CONTROL

BACKGROUND OF THE INVENTION

1. Field of the Invention

The present invention relates to encoding and/or decoding information, for instance in optical recording systems. More particularly, the invention provides a method and system of coding information with improved information density, by imposing both modulation constraints and parity-check constraints in channel coded data sequences.

2. Description of the Related Art

Modulation codes, also known as constrained codes, are used in recording systems to translate an arbitrary sequence of user data into a sequence with special properties required by the relevant systems. Two major constraints for optical recording systems are run-length constraints, or (d, k) constraints, and the dc-free constraint. The run-length constraints bound the minimal and/or maximal lengths of runs of zeros in an encoded data stream, to mitigate the problems of intersymbol interference and inaccurate timing. The dc-free constraint avoids interference between data and servo signals, and also permits filtering of low-frequency disk noise, such as finger marks on the disk surface.

Coding and signal processing techniques play a key role in the development of high density and high speed optical recording systems. CD and DVD systems use modulation codes with the d=2 constraint and threshold-based receivers. Reception techniques for the recently introduced third generation optical recording systems, i.e. blu-ray-disc (BD) or advanced optical disc (AOD), according to T. Narahara, S. Kobayashi, Y. Shimpuku, G. van den Enden, J. Kahlman, M. van Dijk, and R. van Woudenberg, "Optical disc system for digital video recording," Jpn. J. Appl. Phys., pt. 1, vol. 39, no. 2B, pp. 912-919, 2000, and T. Iwanaga, S. Ogkubo, M. Nakano, M. Kubota, H. Honma, T. Ide and R. Katayama, "High-density recording systems using partial response maximum likelihood with blue laser diode," Japan J. Applied Physics, vol. 42, no. 2B, part 1, pp. 1042-1043, February 2003, are significantly different from those used in CDs or DVDs. For example, the threshold detector is supplemented by more powerful Viterbi-like bit detection approaches, and the minimum run-length constraint is d=1 instead of d=2.

A new family of very efficient codes with the d=1 or d=2 constraints is proposed in U.S. Pat. No. 6,606,038, U.S. Pat. No. 6,639,524, and K. A. S. Immink, J. Y. Kim, and S. W. Suh, "Efficient Dc-free RLL codes for Optical Recording," IEEE Trans. Commun, vol. 51, pp. 326-331, March 2003. The rates of the designed codes are greater than the rate 2/3 (1,7) codes used for BD and AOD, and the rate 8/15 (2,10) EFM-like code used for DVD. The capacity-approaching code rates are achieved by using specific efficient finite state machines (FSM) to reflect the d=1 and d=2 constraints. Furthermore, by combining the Guided Scrambling (GS) approach with the newly designed codes, satisfactory dc-free performance is achieved.

Higher recording capacity and data transfer rate systems need to utilise improved channel coding and detection schemes. In recent years, there has been much interest in constrained codes that have error correction properties. The reason is that, unlike the situation in conventional read channels, where the Reed-Solomon (RS) error correction code (ECC) is expected to correct all the errors that occur at the output of the constrained decoder, the most probable (also called dominant) error events can be corrected by the application of a distance enhancing parity-check code. This parity-check code is an inner block-ECC, which is used separately from the outer RS-ECC. It may correct dominant short error events that occur at the output of the channel detector, using only a few redundant parity-check bits. In this way, the correction capacity loss of the outer ECC is significantly reduced and the error propagation of the modulation decoder is also minimised, thus resulting in a simple and efficient solution to improve the overall performance. Compared with iteratively decodable codes, such as turbo codes or low density parity-check codes, the parity-check codes based approach has found wide acceptance in data storage systems, since the performance-complexity trade-off offered by these codes is very attractive and affordable. Therefore, it is one of the most promising reception techniques for so-called 'fourth generation' optical storage systems.

Parity-check codes may be classified into single-bit parity-check codes and multiple-bit parity-check codes. A single-bit parity-check code with even (or odd) parity-check is a simple and basic code, which can detect only a few types of error events. For improved performance, multiple-bit parity-check codes are preferred, according to K. Cai, V. Y. Krachkovsky, and J. W. M. Bergmans, "Performance bounds for parity coded optical recording channels with d=1 constraint", Proc. of IEEE International Conference on Communications (ICC), Alaska, USA, May 2003, and H. Sawaguchi, S. Mita, and J. K. Wolf, "A concatenated coding technique for partial response channels," IEEE Trans. Magnetics, vol. 37, No. 2, pp. 695-703, March 2001, since such codes can detect many more types of error events in one data block, and provide more side information for error correction.

When a parity-check constraint is imposed on a channel bit stream, the modulation constraints should be simultaneously satisfied. As a result, a certain code rate loss will be incurred. Therefore, the design of efficient constrained parity-check codes is key to the development of parity-check code based receivers. Although many attempts have been made by researchers in recent years to combine a constrained code with a parity-check code efficiently, the systematic design of constrained parity-check codes with minimum code-rate loss remains an open problem. It is especially difficult to design constrained parity-check codes that satisfy multiple-bit parity-check constraints for optical recording systems.

In one scheme described by P. Perry, M. C. Lin, and Z. Zhang, "Runlength-Limited Codes for Single Error-Detection and Single Error-Correction with Mixed Type Errors," IEEE Trans. Inform. Theory, vol. 44, no. 4, pp. 1588-1592, July 1998, a constrained data sequence is parsed into shorter pieces of equal length. Between each pair of the constrained data block, a parity data block is inserted for error control. The constrained data blocks and parity data blocks are connected such that no violation of the modulation constraints occurs. The advantage of this scheme is the lack of error propagation. However, it still has general losses, since only specific mixed-type errors for the magnetic recording system can be corrected. Furthermore, its coding efficiency is low. For detection of a single mixed-type error, parity blocks of length 2d+3 are required.

Concatenated coding is further proposed to construct modulation codes with error detection and correction capabilities, as discussed in S. Gopalaswamy and J. W. M. Bergmans, "Modified target and concatenated Coding for constrained magnetic recording channels," in Proc. IEEE Intl. Conf. Commun. (ICC), New Orleans, USA, June 2000, pp. 89-93 and H. Sawaguchi, S. Mita, and J. K. Wolf, "A concatenated coding technique for partial response channels," IEEE Trans. Magnetics, vol. 37, No. 2, pp. 695-703, March 2001. In the concatenated coding scheme, parity-check information is first calculated for each modulation coded data block. This information is then separately encoded by a standard constrained encoder and appended to the end of the corresponding modulation data block. In this way, the concatenated coding scheme achieves high coding efficiency. For a d=2 code with rate around 0.5, a parity-check bit requires 2 channel bits. For a rate 2/3 (1,7) code, a parity-check bit requires 1.5 channel bits. However, the concatenated coding scheme has two drawbacks: (i) during decoding, local demodulation is needed to derive the parity-checks. Thus, part of the channel bit-stream corresponding to the parity-check bits needs to be modulation decoded first, before the parity-check information for the combined data block can be obtained. Obviously, this will increase the decoding complexity. (ii) the channel bit-stream corresponding to the parity-check bits is not protected by parity-checks. Therefore, errors occurring in the parity-related data block may lead to further errors during the decoding of the whole data block. Thus results in error propagation.

A combi-code scheme (proposed in US patent publication US A1 2003/0028839 and by W. Coene, H. Pozidis, J. Bergmans in "Run-length limited parity-check coding for transition-shift errors in optical recording", in Proc. IEEE Intl. Conf. Global Telecommun. [GLOBECOM], San Antonio, November 2001, pp. 2982-2986) also achieves high efficiency similar to the concatenated scheme, without introducing error propagation. According to this scheme, the constrained parity-check code consists of a set of two sliding block codes: a standard code and a parity-check enabling code. The leading part of the constrained parity-check code includes several standard codes, which are chosen to be conventional constrained codes. At the end of the constrained parity-check code, a parity-check enabling code is used to realise a certain parity-check on the whole code word. Because the two constituent codes are based on the same FSM, no additional channel bits are needed for stitching the two codes together. In this way, high efficiency d=2 constrained parity-check codes, which achieve 2 channel bits per parity-check bit, have been designed. However, the combi-code scheme has several drawbacks.

First, the combi-code scheme is designed to correct a specific type of error event (i.e. single-bit transition shift error, or n-bit transition shift errors in the same direction). It is difficult to generalise the scheme to detect an arbitrary type of error event as well as error event combinations.

Second, the combi-code scheme achieves high efficiency only for d=2 codes. For d=1 codes that are used in third generation optical recording systems, highly efficient combi-codes are not available. Coene et al. (cf. above) proposed that high efficiency d=1 codes can be obtained by either (i) using a sophisticated time-varying encoder, or (ii) combining parity-check enabling codes with dc-free enabling codes. The disadvantage of a time-varying encoder is that, for each phase of the encoder, a separate code is required. This will cause significant increases in the implementation complexity. On the other hand, the combination of parity-check enabling codes with dc-free enabling codes will weaken the dc-suppression. This is because, to get a satisfactory dc-suppression, dc-free enabling codes need to be inserted more frequently than the parity-check enabling codes.

Third, the main component code (i.e. the standard code) used by the combi-code scheme is still a rate 2/3 (1,7) code for d=1 constraint, and a rate 8/15 (2,10) code for d=2 constraint. The efficiency of both the standard codes and the parity-check enabling codes could be further improved by using the state splitting method proposed by Immink et al. (cf. above).

The present invention overcomes the above-mentioned drawbacks of the prior art schemes. More particularly, the present invention provides a general and systematic way for constructing capacity-approaching constrained codes with any given parity-check constraint, which can detect and correct any type of dominant error event as well as error event combinations, for instance in optical recording systems.

SUMMARY OF THE INVENTION

According to one aspect of the present invention, there is provided a method of encoding data from a data source, an input segment of user data having been partitioned into data words. The method comprises: encoding the data words into one or more first component code words and a second component code word; and concatenating the first component code words with the second component code word to provide a combined code word, with a pre-determined parity-check constraint over the combined code word. The one or more first component code words comprise one or more code words of a normal constrained code and the second component code word comprises a code word of a parity-related constrained code.

According to a second aspect of the present invention, there is provided a method of designing a parity-related constrained code for use with a sequence of normal constrained code words. The method comprises: designing candidate code words of the parity-related constrained code; computing parity-check bits of the candidate code words; distributing the candidate code words into a group of code word sets; concatenating the code word sets together; and forming a code table for at least one of encoding and decoding of the parity-related constrained code.

According to a third aspect of the present invention, there is provided encoding apparatus for encoding user data from a data source, where an input segment of user data has been partitioned into data words. The apparatus comprises: first encoder means for encoding one or more data words into one or more first component code words; second encoder means for encoding a data word into a second component code word; and concatenator means for concatenating the one or more first component code words with the second component code word to provide a combined code word, with a pre-determined parity-check constraint over the combined code word. The first component code words comprise one or more code words of a normal constrained code and the second component code word comprises a code word of a parity-related constrained code.

According to a fourth aspect of the present invention, there is provided an encoder for encoding user data from a data source, where an input segment of user data has been partitioned into data words. The encoder comprises: a plurality of first encoders for encoding data words into first component code words; a second encoder for encoding a data word into a second component code word; and a concatenator for concatenating the first component code words with the second component code word to provide a combined code word, with a predetermined parity-check constraint over the combined code word. The first component code words comprise code words of a normal constrained code and the second component code word comprises a code word of a parity-related constrained code.

The apparatus or encoder of the third or fourth aspects may be operable according to the method of the first or second aspects.

According to a fifth aspect of the present invention, there is provided a method of decoding a constrained parity-check code word into a segment of user data, the code word comprising a concatenation of first and second component code words. The method comprises decoding a plurality of first component code words and the second component code words into a plurality of user data words. The first component code words comprise normal constrained code words and the second component code word comprises a parity-related constrained code word.

Where the normal constrained code and the parity-related constrained code are based on the same FSM, the decoding method of the parity-related constrained code can generally be the same as that of the normal constrained code. Thus, by observing the next code word and obtaining its state information through a corresponding code table, and combining this information with the knowledge of the current code word, the decoders can uniquely determine the user data word associated with the current code word.

According to a sixth aspect of the present invention, there is provided decoder apparatus for decoding a constrained parity-check code word into a segment of user data, the code word comprising a concatenation of first and second component code words. The apparatus comprises: first decoder means for decoding the plurality of first component code words into a plurality of user data words; and second decoder means for decoding the second component code word into a user data word. The first component code words comprise normal constrained code words and the second component code word comprises a parity-related constrained code word.

According to a seventh aspect of the present invention, there is provided a decoder for decoding a constrained parity-check code word into a segment of user data, wherein the code word comprises a plurality of normal constrained code words to which is concatenated a parity-related constrained code word. The decoder comprises: a plurality of normal constrained decoders to decode the plurality of normal constrained code words; and a parity-related constrained decoder for decoding the parity-related constrained code word.

Where the normal constrained code and the parity-related constrained code are based on the same FSM, the operation of the parity-related constrained decoder can generally be the same as that of the normal constrained decoder. By observing the next code word and obtaining its state information through a corresponding code table, and combining this information with knowledge of a current code word, the decoders can uniquely determine the user data word associated with the current code word.

The apparatus or decoder of the sixth or seventh aspects may be operable according to the method of the fifth aspect.

According to an eighth aspect of the present invention, there is provided memory means storing therein data encoded by the method of the first aspect or by the apparatus of the third or fourth aspect.

The present invention is able to provide a general and systematic way for constructing efficient constrained parity-check codes, for instance for optical recording systems. According to embodiments of the present invention, a constrained parity-check code includes two types of component codes: the normal constrained code and the parity-related constrained code, which are all designed to have the rates close to the Shannon capacity. The parity-check constraint over the entire code word is realised by concatenating the normal constrained code words with a specific parity-related constrained code word chosen from a candidate code word set. Both the component codes are finite-state codes with fixed lengths, which are designed based on the same FSM. This enables them to be concatenated in any order without violating the modulation constraints, and also facilitates significantly simpler hardware implementation of the encoder/decoder. The parity-check constraint is defined by the parity-check polynomial or parity-check matrix of a systematic linear block code. This provides a systematic way for defining the error detection criterion of the constraint parity-check codes. As a result, the codes constructed can detect any type of dominant error event as well as error event combinations of the system.

Preferred first and second embodiments of the present invention provide methods to design a code in the non-return-to-zero inverted (NRZI) format and the non-return-to-zero (NRZ) format, respectively. Designing the codes in NRZ format may reduce the number of parity-check bits required for error detection and simplify error correction (or post-processing). As will be appreciated, the parity-check codes used can be any linear block codes in the systematic form. The modulation constraint adopted can be any d constraint (d=1 and d=2). The new codes designed do not suffer from the error propagation between the parity-related constrained code word and the normal constrained code words, since the parity-related constrained code word is also protected by parity-check. Furthermore, stricter k constraint and the maximum transition run (MTR) constraint can also be added in the designed codes, by increasing the length of the code word, or the number of states of the FSM.

By using the schemes provided by the embodiments of the present invention, various new constrained parity-check codes fitting to different recording systems can be designed. Examples of several new codes that are designed according to the present invention are illustrated. The performance of the newly designed codes in the BD systems is also evaluated.

BRIEF DESCRIPTION OF THE DRAWINGS

The present invention will now be explained in more detail in the following description of exemplary and non-limitative preferred embodiments, with reference to the accompanying drawings, in which:

FIG. 4 shows an example of a code table according to the first embodiment for constructing a rate 2/5 d=1 parity-related constrained code;

FIG. 5 shows an example of an encoding process for a rate 2/5 d=1 parity-related constrained code;

FIG. 7 is a flowchart relating to the operation of the decoder of FIG. 6;

FIG. 9 shows the distribution of candidate code words in various encoder states for a rate 12/19 (1,18) parity-related constrained code;

FIG. 10 shows the beginning portion of a code table for the rate 12/19 (1,18) parity-related constrained code;

FIGS. 11A and 11B show the distribution of candidate code words in various encoder states for a rate 7/16 (1,18) parity-related constrained code;

FIGS. 12A and 12B show examples from the beginning portion of a code table for the rate 7/16 (1,18) parity-related constrained code;

FIG. 13 shows the distribution of candidate code words in various encoder states for a rate 10/20 (2,15) parity-related constrained code;

FIG. 14 shows the beginning portion of a code table for the rate 10/20 (2,15) parity-related constrained code;

FIGS. 15A and 15B show the distribution of candidate code words in various encoder states for a rate 8/22 (2,15) parity-related constrained code;

FIGS. 16A and 16B show examples from the beginning portion of a code table for the rate 8/22 (2,15) parity-related constrained code;

DETAILED DESCRIPTION OF THE PREFERRED EMBODIMENT

Figure 1:
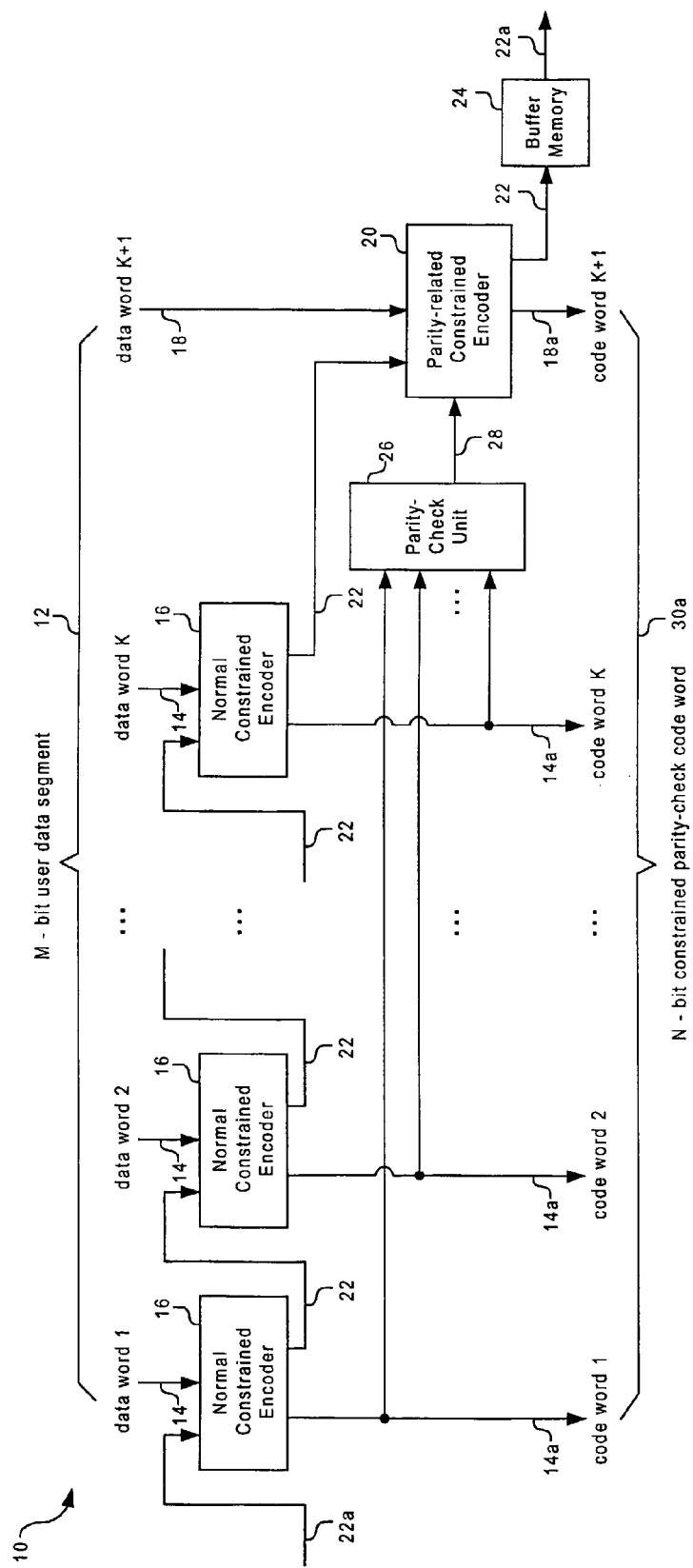
FIG. 1 shows a block diagram of an encoder according to a first embodiment, for constructing a constrained parity-check code in NRZI format.

General principles for code design according to preferred embodiments of the present invention are first described. Subsequently, specific first and second preferred embodiments are presented. Afterwards, examples of new codes that are designed according to the present invention, as well as their performance evaluations are illustrated.

1. General Principles for Code Design

A sequence of user data, which may typically be the binary output of an error correction code (ECC) encoder, is separated into consecutive data blocks, referred to hereafter user data segments. Each user data segment is further partitioned into several data words and then encoded separately.

All the data words except the last one are encoded by the coding method proposed by Immink et al. (cf. above). The obtained code words are referred to as "normal constrained code words". The last data word is, however, encoded by a specific parity-related constrained encoder, and the obtained code word is referred to as the "parity-related constrained code word". It is designed to realise a certain parity-check constraint over the entire code word, which is a concatenation of the normal constrained code words and the parity-related constrained code word. The parity-check constraint to be imposed corresponds to a predetermined parity-check polynomial or parity-check matrix, which is defined to detect dominant error events or error event combinations of a specific data storage system. For ease in imposing the modulation constraints, the parity-check polynomial or parity-check matrix needs to be chosen or designed to generate a systematic parity-check code. The information bits that satisfy the modulation constraints are used as the code words for both the normal constrained code and the parity-related constrained code, and the parity-check bits are used only for guiding the concatenation of the normal constrained code words and the parity-related constrained code word.

Both the normal constrained code and the parity-related constrained code are finite-state constrained codes designed based on the same FSM that is proposed by Immink et al. (cf. above), since capacity-approaching codes can thereby be obtained. This also enables the two component codes to be connected seamlessly, without violating the (d, k) constraints. For the normal constrained code, there is only one code word mapped to each user data word, in each state of the FSM. For the parity-related constrained code, on the other hand, there is a set of $2^p$ candidate code words potentially mapped to each user data word, in each state of the FSM, where p is the number of parity-check bits. Compared with the normal constrained code, the code word length of the parity-related constrained code has to be longer to achieve the additional parity-check constraint, and hence its rate is smaller. To minimise the rate loss due to the parity-check constraint, the parity-related constrained code is only used as the last code word in the combined code word.

The rate of a constrained parity-check code with such a structure is given by $$R = M/N \quad \quad (1)$$
$$= R_n - (n/N)(R_n - R_p),$$

where M is the length of the segment of user data, N is the length of the combined constrained parity-check code word, and n is the length of the parity-related code word.

Here, $R_n$ and $R_p$ are the rates of the normal constrained code and the parity-related constrained code, respectively. The choice of the combined code word length N, or the number of consecutive user data segments within a user data sequence, depends on the specific recording system and is a compromise between the code rate loss due to the parity-check and the error correction capability of the post-processor. The post-processor can correct both single and double error events that occur within each detected constrained parity-check code word, by using the parity-check result of the detected code word at the output of the channel detector, as well as the channel side information obtained at the input of the channel detector.

In the writing path of a data storage system, a precoder, e.g. a modulo-2 integration operation, converts the binary outputs of the constrained encoder into a corresponding modulated signal. The modulated signal is further stored on the storage medium. The constrained encoded bits before the precoder are referred to as an NRZI sequence, while the precoder output bits are referred to as an NRZ sequence. Correspondingly, in the reading path, there exists an inverse precoder between the channel detector and the constrained decoder. It converts the detected NRZ sequence back to a NRZI sequence.

Using the above code design principles, efficient constrained parity-check codes can be designed either in NRZI format or in NRZ format. Corresponding detailed methods are illustrated in the following two embodiments.

2. Code Design Method According to a First Embodiment

Figure 2:
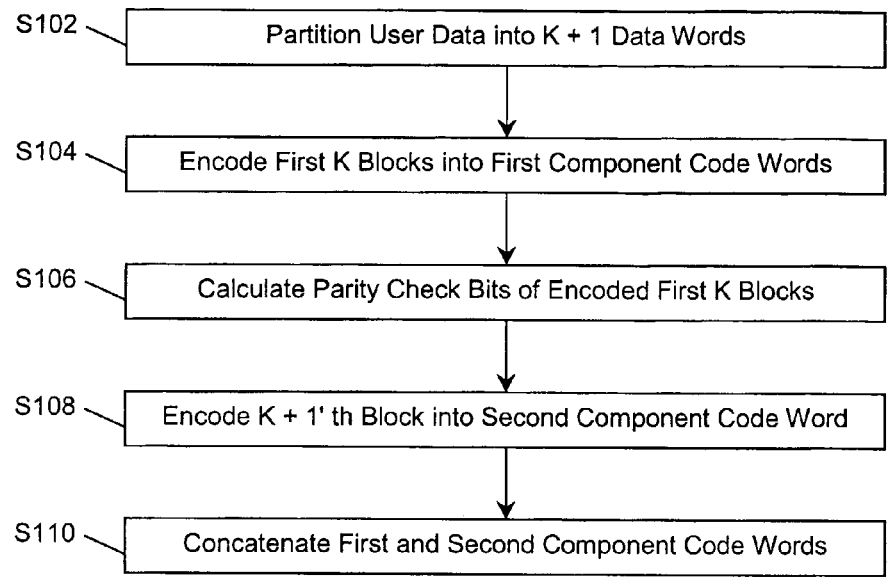
FIG. 2 is a flowchart relating to the operation of the encoder of FIG. 1.

In a first preferred embodiment, the codes are designed in NRZI format. FIG. 1 is a schematic block diagram of encoding apparatus according to a first embodiment of the invention, in the form of a constrained parity-check encoder 10, which may, for example, operate according to the process illustrated in the flowchart of FIG. 2. As illustrated, an M-bit segment of user data 12 is partitioned into K+1 data words (step S102). Among these data words, the K leading data words 14 are individually encoded into first component code words (step S104) by normal constrained encoders 16. At the encoder outputs, K normal constrained code words 14a are obtained. The K+1'th data word 18 is encoded into a second component code word (step S108), which is denoted as the parity-related constrained code word 18a, by a parity-related constrained encoder 20. During encoding the data words into the two component code words 14a and 18a, following state information 22, for instance obtained from a code table stored in a read only memory (ROM) or implemented through a combinatorial logic circuit, is passed from each encoder 16 or 20 to the next encoder 16 or 20, which is one encoder to the right in FIG. 1. This state information indicates the next state from which to select a code word for encoding the next data word. In the case of the parity-related constrained encoder 20, the output of the following state information 22 is first stored in a buffer memory 24. The stored state information 22a at the output of the buffer memory is then passed to the first normal constrained encoder 16 of the encoder 10 while encoding data word 1 of the next data segment. Thus, the first normal constrained encoder 16 has inputs in the form of the data word 1 of the current data segment, and the state information obtained from the output of the parity-related constrained encoder 20 while encoding the previous data segment. For the very first data segment, the initial following state of the first normal constrained encoder 16 is assumed to be state 1 ($S_1$). The encoders 16 and 20 are based on the same FSM, and this encoding process ensures that the (d, k) constraints are satisfied, without introducing further redundant bits between the component code words.

The apparatus further includes a parity-check unit 26, which calculates the parity-check bits of the sequence comprising the leading K normal constrained code words (step S106). The calculation of the parity-check bits for a given data sequence follows the standard method for encoding linear block codes, as described in S. Lin and D. J. Costello, Error Control Coding Fundamentals and Applications, Prentice-Hall Inc., 1983. The obtained parity-check bits 28 are passed to the parity-related encoder 20, and used to guide encoding the K+1'th data word into the parity-related constrained code word 18a and to realise a predetermined parity-check constraint over the combined code word. Concatenating the normal constrained code words 14a and the parity-related constrained code word 18a together (step S110), results in the combined constrained parity-check code word 30a in NRZI format. The encoder 10 then proceeds with the next data segment of the input user data sequence. The concatenation of the obtained N-bit constrained parity-check code words forms the channel encoded data sequence in NRZI format.

In the design of the normal constrained code, this embodiment uses the FSM proposed by Immink et al. (cf. above), since rates of the constrained codes obtained are very close to the capacity. To achieve a high encoding efficiency, in each state of the FSM one data word is mapped to one code word only. Other FSMs can also be used in conjunction with embodiments of the present invention. However, the obtained code rates may not be as high as that using the FSM proposed by Immink et al. (cf. above).

Figure 3:
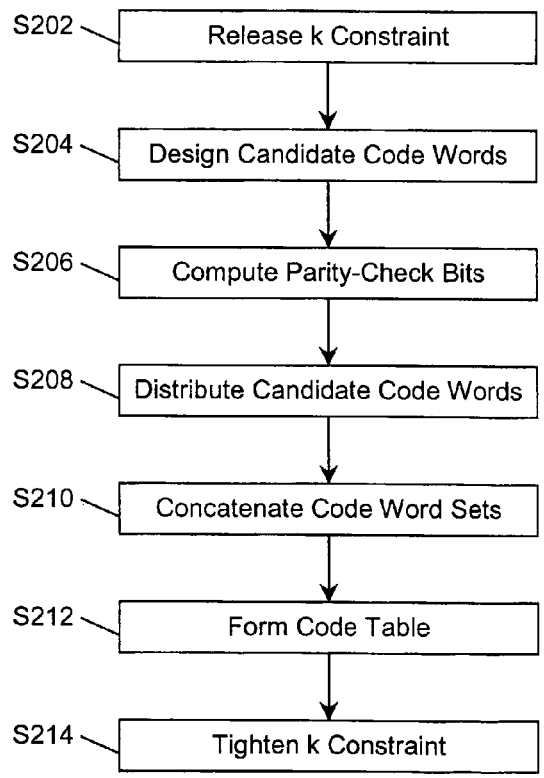
FIG. 3 is a flowchart relating to the design of parity-related constrained codes for use in the encoder of FIG. 1.

In the design of the parity-related constrained code, this embodiment uses a novel approach, to design sets of candidate code words with various parity-check bits, based on the same FSM of the normal constrained codes. The various parity-check bits of the candidate code words correspond to a predetermined parity-check polynomial or parity-check matrix, which is defined to detect dominant error events or error event combinations of a specific system. The main steps for the design of the parity-related constrained code in this embodiment are as follows, with reference to FIG. 3.

(1) First release the k constraint (e.g. larger than k=7 for d=1 codes, and larger than k=10 for d=2 codes) (step S202) and design candidate code words of the parity-related constrained code (step S204) (e.g. using the FSM proposed by Immink et al. [cf. above], and following a set of criteria described below), to achieve a capacity approaching code rate. The candidate code words are constructed based on the same FSM with the normal constrained code. For the same length of user data, the length of a parity-related constrained code word needs to be longer than that of the normal constrained code word in order to achieve a specific parity-check constraint.

(2) Based on the given parity-check polynomial or parity-check matrix, and taking into account the length of the sequence comprising the normal constrained code words, compute the parity-check bits (step S206) of the candidate code words obtained from Step (1) and distribute them (step S208) into a group of code word sets. A total of $2^p$ code word sets are obtained.

(3) Concatenate the $2^p$ code word sets together (step S210), and form a code table (step S212) for encoding/decoding of the parity-related constrained code. Compared with the code table of the normal constrained code, the code table designed for the parity-related constrained code is enlarged by a factor of $2^p$. In each state of the FSM, there is a set of $2^p$ candidate code words potentially mapped to one user data word. During encoding, as illustrated in FIG. 1, the parity-check bits of the sequence of the normal constrained code words are first calculated, and the parity-related code word having the same parity-check bits is selected from the candidate code word set and assigned to the user data word.

(4) Tighten the k constraint of the candidate code words (step S214) in the table obtained from step (3), towards the original k, by optimising the code table through deleting code words that start or end with long runs of '0's, or by increasing the number of states in the FSM.

The present embodiment provides a set of criteria that guide the design of the parity-related constrained code. These criteria give clear indications on the choice of size of the code, as well as the number of states in the code table for a given parity-check constraint. They are summarised below.

i. With d=1 codes

For the design of the parity-related constrained code with m user data bits, and p parity-check bits, the number of candidate code words leaving a state set, which consists a group of states of the same type, should be at least $2^{m+p}$ times that of the number of states within the state set. With the FSM of d=1 codes proposed by Immink et al. (cf. above), we can obtain the following criteria:

$$S|C_{00}|+S_1|C_{01}|\geq S_1 2^{m+p}, \qquad (2)$$

$$S(|C_{00}|+|C_{10}|)+S_1(|C_{01}|+|C_{11}|)\geq S_2 2^{m+p}, \qquad (3)$$

where $C_{00}$ denotes the set of candidate code words that start and end with a '0', $C_{01}$ denotes the set of candidate code words that start with a '0' and end with a '1', $C_{10}$ denotes the set of candidate code words that start with a '1' and end with a '0', and $C_{11}$ denotes the set of candidate code words that start and end with a '1'. Here, $|C_{xy}|$ denotes the size of $C_{xy}$.

For d=1 codes, the candidate code words are divided into S states, which are further classified into two sets of states. The first state set has $S_1$ states, and it includes candidate code words that start with '0'. The second state set includes $S_2=S-S_1$ states, and it includes candidate code words that start with either '0' or '1'. With given m, p, as well as the number of the encoder states S and $S_1$, the criteria (2) and (3) indicate the smallest length n of the candidate code word that may be obtained for the parity-related constraint code. The corresponding code rate is $R_p=m/n$.

The length n of the candidate code word is further decided by the following criteria. Thus, for each set of the candidate code words that have the same parity-check bits, the number of candidate code words leaving a state set should be at least $2^m$ that of the number of states within the state set. The criteria are therefore given by $$S|\check{C}_{00}|+S_1|\check{C}_{01}|\geq S_1 2^m, \qquad (4)$$

$$S(|\check{C}_{00}|+|\check{C}_{10}|)+S_1(|\check{C}_{01}|+|\check{C}_{11}|)\geq S_2^m, \qquad (5)$$

where $\check{C}_{00}$ denotes the set of candidate code words with the same parity-check bits that start and end with a '0', $\check{C}_{01}$ denotes the set of candidate code words with the same parity-check bits that start with a '0' and end with a '1', $\check{C}_{10}$ denotes the set of candidate code words with the same parity-check bits that start with a '1' and end with a '0', and $\check{C}_{11}$ denotes the set of candidate code words with the same parity-check bits that start and end with a '1'. Here, $|\check{C}_{xy}|$ denotes the size of $\check{C}_{xy}$.

For each set of the candidate code words with the same parity-check bits, each candidate code word has an assigned following state, which specifies the next state from which to select the code word for the next user data word. The same candidate code word that end with a '0' (i.e. candidate code words in sets $\check{C}_{00}$ and $\check{C}_{10}$) can be assigned to up to S different following states in both the first and second state sets, and therefore can be used to map to S different user data words. The same candidate code word that end with a '1' (i.e. candidate code words in sets $\check{C}_{01}$ and $\check{C}_{11}$) can only be assigned to up to $S_1$ following states in the first state set, and therefore can be used to map to $S_1$ different user data words. The particular mapping of candidate code word to the data word as defined in the encoder is a matter of design choice, and is not critical to the operation of the system. However, to ensure reliable decoding, different states cannot contain the same candidate code word.

ii. With d=2 codes

Similarly, with the d=2 constraint, the criteria for designing the parity-related constrained code are:

$$S|C_{0000}|+(S_1+S_2)|C_{0010}|+S_1|C_{0001}|\geq S_1 2^{m+p}, \qquad (6)$$

$$S|C_{0000}|+(S_1+S_2)|C_{0010}|+S_1|C_{0001}|+ \\ S|C_{0100}|+(S_1+S_2)|C_{0110}|+S_1|C_{0101}|\geq (S_1+S_2)2^{m+p}, \qquad (7)$$

$$S|C_{0000}|+(S_1+S_2)|C_{0010}|+S_1|C_{0001}|+S|C_{0100}|+(S_1+S_2)|C_{0110}|+ \\ S_1|C_{0101}|+S|C_{1000}|+(S_1+S_2)|C_{1010}|+S_1|C_{1001}|\geq S2^{m+p}, \qquad (8)$$

where the two leading symbols of the subscript of the candidate code word set C denote the leading two bits of the candidate code words, while the two trailing symbols of the subscript denote the trailing two bits of the candidate code words. Here, $|C_{xyzw}|$ denotes the size of $C_{xyzw}$.

For d=2 codes, the candidate code words are divided into S states, which are further classified into three sets of states. The first state set has $S_1$ states, and it includes candidate code words that start only with '00'. The second state set includes $S_2$ states, and it includes candidate code words that start with one of '10', '01' or '00'. The third state set includes $S_3=S-S_1-S_2$ states, and it includes candidate code words that start with either '01' or '00'. With given m, p, as well as the number of the encoder states S and $S_1$, the criteria (6), (7) and (8) indicate the smallest length n of the candidate code word that may be obtained for the parity-related constraint code. The corresponding code rate is $R_p=m/n$.

The length n of the candidate code word is further decided by the following criteria that guide the design of each set of candidate code words that has the same parity-check bits:

$$S|\check{C}_{0000}|+(S_1+S_2)|\check{C}_{0010}|+S_1|\check{C}_{0001}|\geq S_1 2^m, \qquad (9)$$

$$S|\check{C}_{0000}|+(S_1+S_2)|\check{C}_{0010}|+S_1|\check{C}_{0001}|+ \\ S|\check{C}_{0100}|+(S_1+S_2)|\check{C}_{0110}|+S_1|\check{C}_{0101}|\geq (S_1+S_2)2^m, \qquad (10)$$

$$S|\check{C}_{0000}|+(S_1+S_2)|\check{C}_{0010}|+S_1|\check{C}_{0001}|+S|\check{C}_{0100}|+(S_1+S_2)|\check{C}_{0110}|+ \\ S_1|\check{C}_{0101}|+S|\check{C}_{1000}|+(S_1+S_2)|\check{C}_{1010}|+S_1|\check{C}_{1001}|\geq S2^m, \qquad (11)$$

where $\check{C}$ denotes the set of candidate code words with the same parity-check, and $|\check{C}_{xyzw}|$ denotes the size of $\check{C}_{xyzw}$.

For each set of the candidate code words with the same parity-check bits, the same candidate code word that ends with a '00' (i.e. candidate code words in sets $\check{C}_{0000}$, $\check{C}_{1000}$ and $\check{C}_{0100}$) can be assigned to up to S different following states, and therefore can be used to map to S different user data words. The same candidate code word that ends with a '10' (i.e. candidate code words in sets $\check{C}_{0010}$, $\check{C}_{1010}$, and $\check{C}_{0110}$) can only be assigned to up to $S_1$ following states in the first state set and $S_3$ states in the third state set, and therefore can be used to map to $S_1+S_3$ different user data words. The same candidate code word that ends with a '01' (i.e. candidate code words in sets $\check{C}_{0001}$, $\check{C}_{1001}$ and $\check{C}_{0101}$) can be only assigned to up to $S_1$ different following states in the first state set, and therefore can be used to map to $S_1$ different user data words. The particular mapping of candidate code word to the data word as defined in the encoder is a matter of design choice, and is not critical to the operation of the system. However, to ensure reliable decoding, different states cannot contain the same candidate code word.

A more specific example might be helpful to understand the whole process to design the parity-related constrained code. Assume the design of a short d=1 code with m=2 and a single-bit even parity-check (i.e. p=1). The numbers of encoder states are assumed to be S=5, $S_1$=3, and $S_2$=2. First, use the criteria (2) and (3) to determine the smallest possible length n of the candidate code word. Using an analytical approach (see Kees A. Schouhamer Immink and K. Cai, "On the Size of a Type of RLL Codes," proceedings of the 25th symposium on information theory in the Benelux, Kerdrade, The Netherlands. June 2004, pp 39-46), or computer enumerations, we obtain a length n=5 of the candidate code word. Next, generate all the valid d=1 code words of length n=5 and distribute them into two sets of candidate code words. The first set of candidate code words has an even parity, while the second set of candidate code words has an odd parity. For each set of the candidate code words, distribute the candidate code words according to criteria (4) and (5). The obtained code table is shown in FIG. 4.

FIG. 4 shows the code table for a rate 2/5 d=1 parity-related constrained code with single-bit even parity-check. The first column is the decimal notation of the user data words (i.e. the binary data words 00, 01, 10 and 11 are listed as 0, 1, 2 and 3, respectively). Elements in the second to eleventh columns correspond to candidate code words with even parity and the associated following state information. In particular, the second, fourth, sixth, eighth, and tenth columns are the corresponding candidate code words mapped to the user data words in states 1 to 5, respectively. The third, fifth, seventh, ninth, and eleventh columns are the following state information associated with candidate code words in the second, fourth, sixth, eighth, and tenth columns, respectively. In the same manner, candidate code words with odd parity and their associated following state information are shown in the twelfth to twenty-first columns. For each set of candidate code words with the same parity, the same candidate code word that ends with a '0' can be assigned to up to S=5 different user data words, while the same candidate code word that ends with a '1' can be only assigned to up to S=3 different user data words. Moreover, different encoder states cannot have candidate code words in common. For this reason, in FIG. 4, no candidate code word has been assigned a following state of S=5.

Assuming that the present user data word (18 in FIG. 1) is '11' (binary—i.e. 3 decimal), all the possible cases that might arise during encoding are listed in FIG. 5. The first two columns illustrate the possible parity-check result (28 in FIG. 1) of the normal constrained coded sequence, and the following state information 22 associated with the previous code word (code word K in FIG. 1), respectively. Elements in the third and fourth columns correspond to the obtained current code word (code word 18a in FIG. 1) and the following state information 22 associated with the current code word.

The combined constrained parity-check code is constructed based on two code tables, i.e. the code table of the normal constrained code and the code table of the parity-related constrained code. As shown in FIG. 1, the normal constrained code words are first constructed and connected. Based on the predetermined parity-check polynomial or parity-check matrix, the parity-check bits of the sequence of the normal constrained code words are computed. After that, the parity-related constrained code word that has the same parity-check bits is selected from the candidate code word sets to concatenate directly with the normal constrained code words. A combined code word satisfying both the modulation constraints and the parity-check constraint is thus constructed.

The rates of the designed constrained parity-check codes are close to the Shannon capacity, since the two types of component codes are designed based on an efficient FSM, and no additional redundant bits are required to be inserted between the two component code words to sustain the (d, k) constraints. Furthermore, the parity-related constrained code word is also protected by parity-checks, whose parity-check polynomial or parity-check matrix is consistent with that in the sequence of normal constrained code words. This ensures that errors can be corrected equally well over the entire data block. Therefore, error propagation due to the parity-related constrained code word is avoided.

Figure 6:
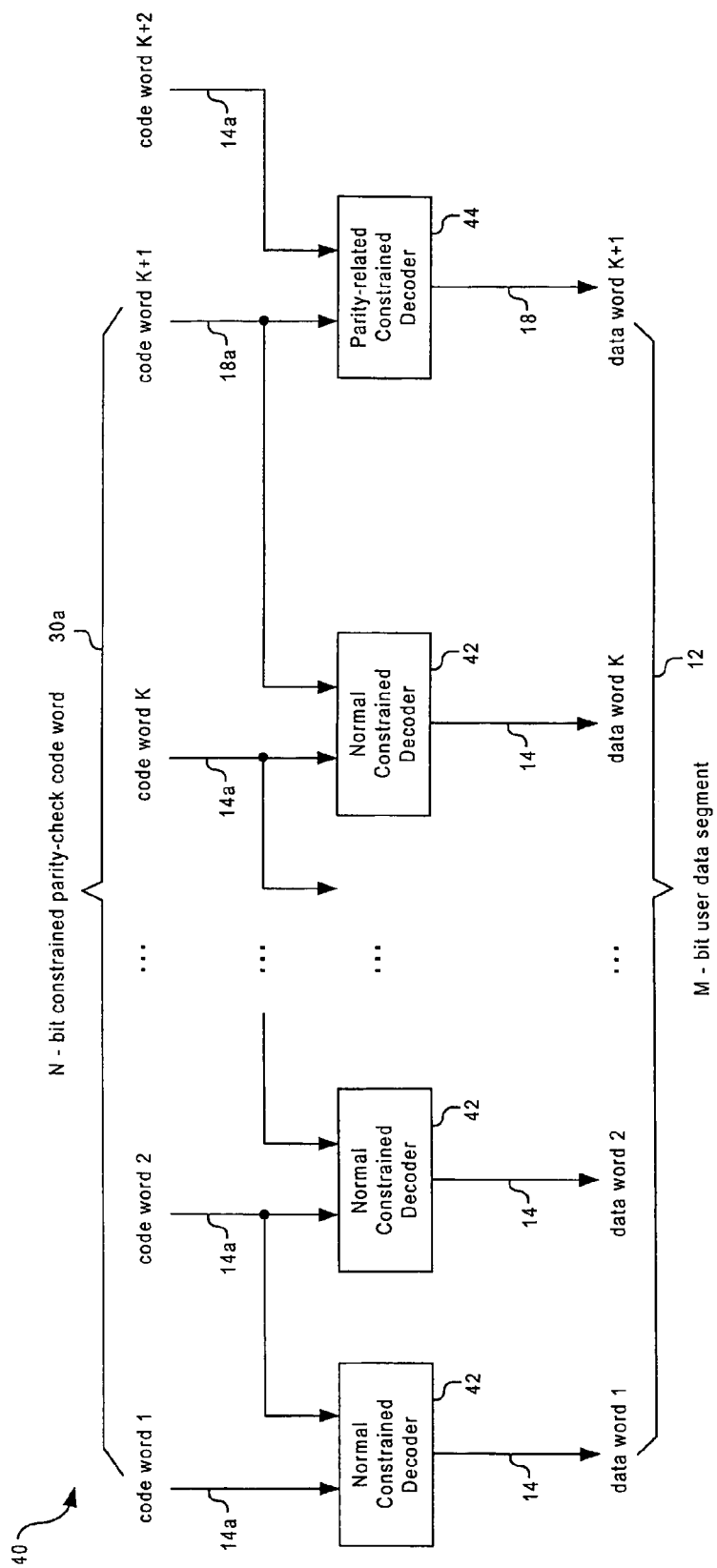
FIG. 6 shows a block diagram of a decoder for use with the first embodiment and a second embodiment.

FIG. 6 illustrates an embodiment of a decoder apparatus in the form of the constrained parity-check decoder 40 for a system for example employing the constrained parity-check encoder 10 described above. The decoder 40 performs the reverse process of the encoder 10 and recovers the M-bit segment of user data words 12 from the N-bit constrained parity-check code word 30a, operating, for example, according to the process illustrated in the flowchart of FIG. 7. As illustrated, the N-bit constrained parity-check code word 30a is separated into K+1 code words 14a, 18a (step S302), which are decoded separately. The K normal constrained code words 14a are decoded by K normal constrained decoders 42 (step S304) into K data words 14. The K+1'th parity-constrained code word 18a is decoded (step S306) by a parity-related constrained decoder 44 into the K+1'th data word 18. The normal constrained decoders 42 operate as described by Immink et al. (cf. above). Since the normal constrained codes and the parity-related constrained codes are based on the same FSM, the operation of the parity-related constrained decoder 44 in this embodiment is generally the same, but with the associated stored code tables being different. As shown, the inputs of the normal constrained decoders 42 and the parity-related constrained decoder 44 are both of the current code word and the next code word. The decoders 42, 44 first inspect the next code word, and get its state information through the stored code table. Thereafter, combining this information with the knowledge of the current code word, the decoders 42, 44 can uniquely determine the user data word associated with the current code word based on the corresponding code table. In the case of the parity-related constrained decoder 44, the input following state information is obtained by observing code word K+2 (i.e. code word 1 of the next N-bit code word), and checking the normal constrained code table associated with the code word K+2. Thus, to decode an N-bit constrained parity-check code word, the decoder 40 needs to inspect one more normal constrained code word of the next N-bit code word. Furthermore, unlike the normal constrained decoders 42 operating based only on one code table of the normal constrained code, the operation of the parity-related constrained decoder 44 is based on two code tables. One code table is the normal constrained code table, which is used to determine the following state of the next code word, while the other code table is the parity-related constrained code table, which is used decode the current code word using the obtained state information of the next code word. In this way, an N-bit constrained parity-check code word is decoded into an M-bit user data segment. The decoder 40 then proceeds with the next N-bit code word in the serial input data, which is referred to as the channel detected data sequences. The similarity in the operation of the two types of decoders 42 and 44 simplifies the hardware implementation.

3. Code Design Method According to a Second Embodiment

In the above description of the code design, the coded bits are all defined in NRZI format. The present invention further proposes an approach to design the code in NRZ format. It may be preferable to encode the data in NRZ format due to the following reasons.

On the one hand, by making use of the parity-check results of the detected sequence of constrained parity-check code words as well as the channel side information, errors occurring in the output sequences of the channel detector can be corrected. The process of inverse preceding may propagate errors in the channel detected data sequence and enlarge the length of error events. This will cause an increase in the number of parity-check bits that are required for detecting errors.

On the other hand, carrying out error correction or post-processing for the constrained parity-check codes at the output of the channel detector is simpler and more straightforward than doing it at the output of the inverse precoder.

To construct constrained parity-check codes in NRZ format, the code table of the normal constrained code can remain the same as that of the normal constrained code in NRZI format. However, the code table for the parity-related constrained code is designed in a different way. The detailed procedures are as follows.

First, design the candidate code words of the parity-related constrained code in NRZI format following the foregoing detailed description. Secondly, compute the parity-check bits of the candidate code words in the NRZ domain, rather than in NRZI domain, based on an assumed initial NRZ bit. Thirdly, distribute the NRZI candidate code words into different sets according to their parity-check bits in the NRZ domain. Further, concatenate various sets of code words together to form the code table for encoding/decoding of the parity-related constrained code in NRZ format. For the two different initial NRZ bits (i.e. '+1', '−1'), the preferred embodiment uses the same code table to simplify the encoding/decoding complexity. However, in the code table, the order of code word sets with the same parity-check bits may need to be adjusted according to the different initial NRZ bits. The criteria that guide the design of the parity-related constrained codes in NRZ format are the same as those guiding the design of the NRZI format codes, the only difference being that the parity-check bits of the candidate code words are computed in the NRZ domain, rather than in the NRZI domain.

Figure 8:
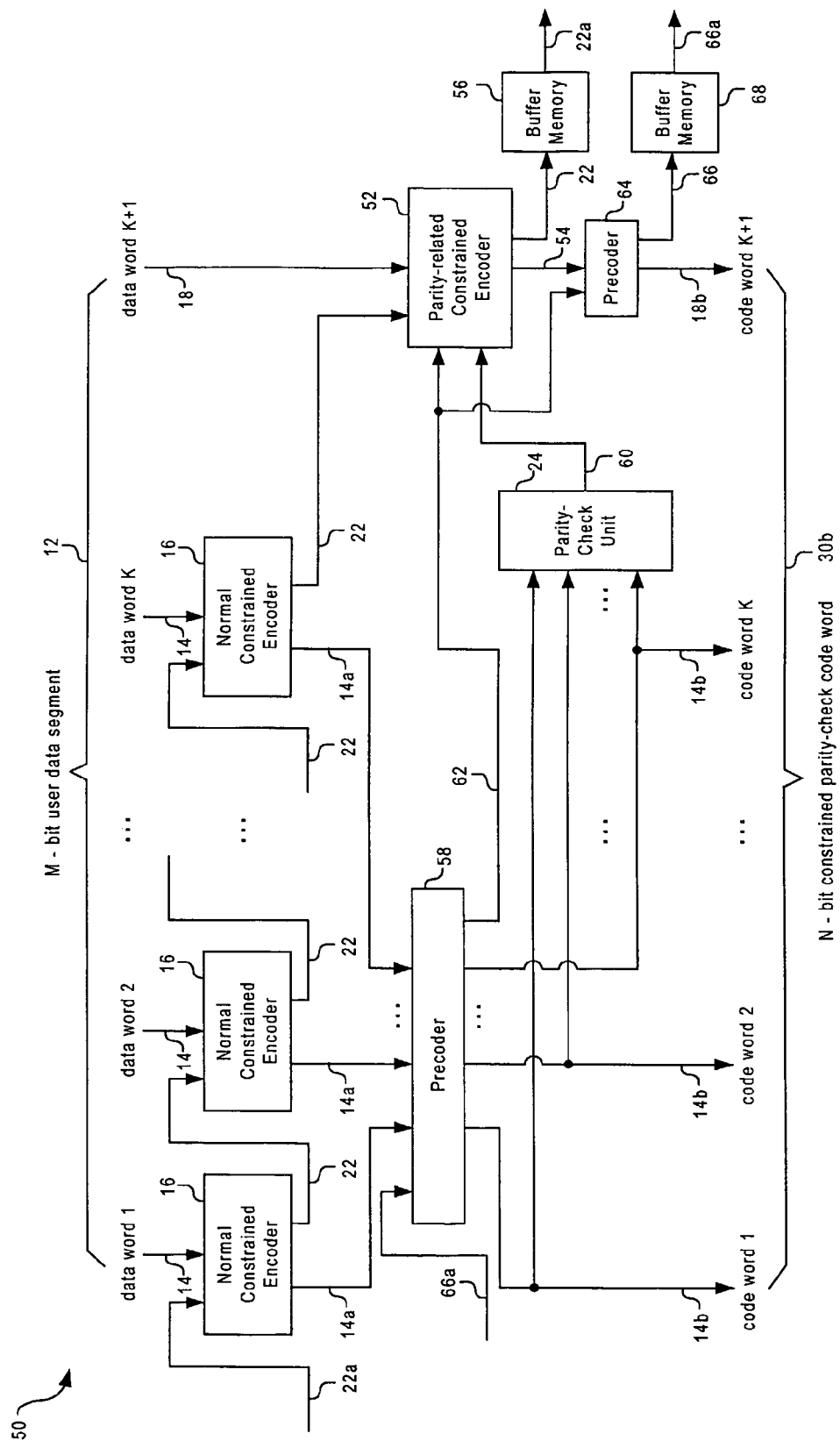
FIG. 8 shows a block diagram of an encoder according to a second embodiment, for constructing a constrained parity-check code in NRZ format.

FIG. 8 illustrates a schematic block diagram of an encoder 50 for encoding the constrained parity-check code in the NRZ format. As illustrated, an M-bit segment of user data 12 is partitioned into K+1 data words. Among these data words, the K leading data words 14 are individually encoded by normal constrained encoders 16. At the encoder outputs, K normal constrained code words 14a are obtained. The K+1'th data word 18 is encoded by a parity-related constrained encoder 52, which outputs a parity-related constrained code word 54 (which is different from the parity-related constrained code word (18a in FIG. 1) produced by the encoder of the first embodiment). During encoding the data words into the two component code words 14a, 54, following state information 22, for instance obtained from a code table stored in a ROM or implemented through a combinatorial logic circuit, is passed from each encoder 16, 52 to the next encoder 16, 52. This state information 22 indicates the next state from which to select a code word for encoding the next data word. In the case of the parity-related constrained encoder 52, the output of the following state information 22 is first stored in a buffer memory 56. The stored state information 22a at the output of the buffer memory is then passed to the first normal constrained encoder 16 of the encoder 50 while encoding data word 1 of the next data segment. Thus, the first normal constrained encoder 16 has as its inputs the data word 1 of the current data segment, and the state information obtained from the output of parity-related constrained encoder 52 while encoding the previous data segment. For the very first data segment, the initial following state of the first normal constrained encoder 16 is assumed to be state 1 ($S_1$). The encoders 16, 52 are based on the same FSM, and this encoding process ensures that the (d, k) constraints are satisfied, without introducing further redundant bits between the two component code words.

More particularly, the user data words 14 associated with the leading K normal constrained codes are first encoded in NRZI format. The resulting constrained code words 14a are then converted into NRZ format through a first precoder 58, to produce precoded constrained code words 14b. The parity-check bits 60 of the sequence comprising the leading K precoded normal constrained code words are computed through a parity-check unit 24, which is the same as that in FIG. 1. In addition to the precoded constrained code words 14b, the first precoder 58 also outputs the last NRZ bit 62 of the K'th precoded normal constrained code word. Based on these NRZ parity-check bits 60 as well as the last NRZ bit 62 of the K'th precoded code word, the parity-related constrained encoder 52 assigns its candidate code word in NRZI format that has the same NRZ parity-check bits to the K+1'th data word 18. The obtained parity-related constrained code word 54 needs to be converted into NRZ format through a second precoder 64, before concatenating with the normal constrained code words 14b in NRZ format. In this way an N-bit constrained parity-check code word 30b in NRZ format are obtained. The second precoder 64 not only outputs the precoded K+1'th code word 18b, but also the last NRZ bit 66 of that precoded K+1'th code word. This last NRZ bit 66 is first stored in a buffer memory 68. The stored last NRZ bit 66a at the output of the buffer memory 68 is then passed to the first precoder 58 of the encoder 50, and is used to encode the next data segment. In other words, the first precoder 58 has as its inputs the normal constrained code words 14a and the last NRZ bit 66a of the precoded K+1'th code word from the previous data segment. For the very first data segment, the initial NRZ bit for the first precoder 58 is assumed to be '−1'. Along the same lines, the subsequent user data segments within the input user data sequence are encoded by the encoder 50 one by one, and the concatenation of the obtained N-bit constrained parity-check code words forms the channel encoded data sequence in NRZ format.

During decoding, the detected NRZ data sequence is first converted into NRZI format through an inverse precoder, and the resulting NRZI sequence is then decoded based on the code tables of the normal constrained code and the parity-related constrained code, along the same lines as in the foregoing detailed description and as shown in FIGS. 6 and 7.

In the above embodiments, the user data is encoded and decoded one segment at a time, with encoding occurring in the original order of the data, and decoding in the original order or the reverse order. In a further embodiment, the encoding may be in reverse order and the decoding then in the reverse order or the correct order.

At the boundary of two data segments, the above embodiments use following state information produced by the last component code encoder while encoding the previous data segment for encoding the first data word of the current data segment. The initial input following state information for encoding the first data word of the first data segment is assumed to be state 1 ($S_1$).

At the boundary of two data segments, the above embodiments use the first component code word of the next constrained parity-check code word for decoding the last component code word of the current constrained parity-check code word.

Further, in the above embodiments, the following state information at the beginning and end of each segment is obtained from the adjacent segment, in both encoding and decoding. In further embodiments, the initial following state information may be derived from non-adjacent segments, e.g. from a segment two away. However, the same first segment used to provide following state information to a second segment in encoding should generally be provided with the following state information from the same second segment in decoding.

4. Examples of New Codes

Using the above proposed code design methods, and others within the scope of the present invention, various new constrained parity-check codes, for instance for optical recording systems can be designed. In the following, examples of several such new codes are illustrated. In these examples, the codes are designed in the NRZ format since this may reduce the number of parity-check bits required for error detection and simplify error correction or post-processing.

For example, using the above embodiments, a new (1,18) constrained single-bit even parity-check code can be designed. The rate 9/13 (1,18) code with a 5-state (i.e. S=5, $S_1=3$, $S_2=2$) FSM, as described by Immink et al. (cf. above) is used as the normal constrained code, since its rate is 3.85% higher that the conventional rate 2/3 (1,7) code that is applied to the BD or the AOD systems. For the parity-related constrained code, by using the code design method described above, a new rate 12/19 (1,18), 5-state (i.e. S=5, $S_1=3$, $S_2=2$)

code can be designed. With respect to the rate 2/3 (1,7) code, the rate 12/19 (1,18) code achieves 1 channel bits per parity-check.

FIG. 9 shows the distribution of candidate code words in S=5 encoder states for the rate 12/19 (1,18) parity-related constrained code. In the figure, the code is designed in NRZ format. Therefore, the parity-check bits of the candidate code words are computed based on an assumed initial NRZ bit of either '−1' or '+1', and the obtained parity-check bits are respectively shown in the first and second entry inside the bracket of the first row. It is found first that among the total 10946 valid d=1 code words of length 19, there are 2135+1275+1275+805=5490 candidate code words having even parity with an assumed initial NRZ bit of '−1' (or odd parity with an assumed initial NRZ bit of '+1'). There are 2046+1309+1309+792=5456 candidate code words having odd parity with an assumed initial NRZ bit of '−1' (or even parity with an assumed initial NRZ bit of '+1'). Each table in FIG. 9 illustrates the distribution of candidate code words with the same parity among the S=5 encoder states. Taking the first table as an example, which contains all the candidate code words having even parity with an assumed initial NRZ bit of '−1' (or odd parity with an assumed initial NRZ bit of '+1'), in the table the total numbers of candidate code words in the code word sets too, $\check{C}_{00}$, $\check{C}_{01}$, $\check{C}_{10}$, and $\check{C}_{10}$, are illustrated in the third row of the second to fifth columns, respectively. The distribution of these candidate code words among the S=5 encoder states is respectively shown in the fourth to eighth rows. As is mentioned above, states 1, 2, and 3 are sub-states in the first state set, which includes candidate code words that start with '0' (i.e. candidate code words in sets $\check{C}_{00}$ and $\check{C}_{01}$) only. States 4 and 5 are sub-states in the second state set, which includes candidate code words that start either with '0' or '1' (i.e. candidate code words in sets $\check{C}_{00}$, $\check{C}_{01}$, $\check{C}_{10}$, $\check{C}_{11}$). The candidate code words are distributed according to the restrictions that the same code word ending with a '0' (i.e. candidate code words in sets $\check{C}_{01}$ and $\check{C}_{11}$) can be assigned to up to S=5 different user data words, while the same candidate code word that ends with a '1' (i.e. candidate code words in sets $\check{C}_{01}$ and $\check{C}_{11}$) can only be assigned to up to $S_1$=3 different user data words. In addition, different states cannot contain the same candidate code word. For example, the set $\check{C}_{00}$ has 605 candidate code words allocated in State 1, 599 candidate code words in state 2, and 603 candidate code words in state 3. The total number of assigned candidate code words is 605+599+603=1807, which is smaller than 2135, the total number of candidate code words in set $\check{C}_{00}$. On the other hand, for state 1, the total number of assigned candidate code words is 605*5+358*3=4099, which is sufficient to map $2^{12}$=4096 user data words. Similarly, it can be verified that from any of the S=5 encoder states, there are at least 4096 candidate code words that can be assigned to the user data words. This means that 12-bit user data words can be encoded. In the same manner, candidate code words having odd parity with an assumed initial NRZ bit of '−1' (or even parity with an assumed initial NRZ bit of '+1') are distributed as shown in the second table in FIG. 9. This table also shows that 12-bit user data words can be supported. Hence, following the tables shown in FIG. 9, a rate 12/19 (1,18) parity-related constrained code can be constructed.

FIG. 10 shows the beginning portion of the code table for the rate 12/19 (1,18) parity-related constrained code. The first column is the decimal notation of the user data words. Elements in the second to eleventh columns correspond to the decimal notation of the candidate code words having even parity with an assumed initial NRZ bit of '−1' (or odd parity with an assumed initial NRZ bit of '+1'), and the associated following state information. In particular, the second, fourth, sixth, eighth, and tenth columns are the corresponding candidate code words mapped to the user data words in states 1 to 5, respectively. The third, fifth, seventh, ninth, and eleventh columns are the following state information associated with candidate code words in the second, fourth, sixth, eighth, and tenth columns, respectively. In the same manner, candidate code words having odd parity with an assumed initial NRZ bit of '−1' (or even parity with an assumed initial NRZ bit of '+1') and their associated following state information are shown in the twelfth to twenty-first columns.

With a rate 9/13 (1,18), 5-state (i.e. S=5, $S_1$=3, $S_2$=2) code as the normal constrained code, a new multiple-bit parity-check code can further be designed. It is defined by the parity-check polynomial g(x)=1+x+$x^4$. A rate 7/16 (1,18), 5-state (i.e. S=5, $S_1$=3, $S_2$=2) parity-related constrained code is then designed. With respect to the rate 2/3 (1,7) code, the rate 7/16 (1,18) code achieves 1.375 channel bits per parity-check. FIGS. 11A and 11B show the distribution of candidate code words in S=5 encoder states for the rate 7/16 (1,18) parity-related constrained code in the same fashion as FIG. 9. Note that with a 4-bit parity-check, there are 16 distribution tables illustrated in FIGS. 11A and 11B, corresponding to the various parity-check bits of the candidate code words. In computing the parity-check bits of the candidate code words in the tables, it is assumed that the normal constrained coded sequence is un-shortened.

FIGS. 12A and 12B are examples from the beginning portion of the code table for the rate 7/16 (1,18) parity-related constrained code, in the same manner that FIG. 10 illustrated the code table for the 12/19 code. With a 4-bit parity-check, there are 16 groups of candidate code words sets with the same parity-check bits concatenated in the code table. FIGS. 12A and 12B illustrate the first two of these and the last two, respectively.

For d=2 codes, with the rate 6/11 (2,15), 9-state (i.e. S=9, $S_1$=4, $S_2$=3, $S_3$=2) code as the normal constrained code, a new single-bit even parity-check code and a new 4-bit parity-check code defined by the parity-check polynomial g(x)=1+x+$x^4$ are designed. The parity-related constrained codes are a rate 10/20 (2,15), 9-state (i.e. S=9, Sl=4, $S_2$=3, $S_3$=2) code and a rate 8/22 (2,15), 9-state (i.e. S=9, $S_1$=4, $S_2$=3, $S_3$=2) code, respectively. With respect to the rate 8/15 (2,10) EFM-like code, the rate 10/20 (2,15) code achieves 1.25 channel bits per parity-check, and the 8/22 (2,15) code achieves 1.75 channel bits per parity-check.

FIG. 13 shows the distribution of candidate code words in S=9 encoder states for the rate 10/20 (2,15) parity-related constrained code. It is found first that, among the total 2745 valid d=2 code words of length 20, there are 299+139+203+204+95+138+138+65+93=1374 candidate code words having even parity with an assumed initial NRZ bit of either '−1' or '+1'. There are 296+138+203+202+94+139+139+64+96=1371 candidate code words having odd parity with an assumed initial NRZ bit of either '−1' or '+1'. Each table in FIG. 13 illustrates the distribution of candidate code words with the same parity among the S=9 encoder states. Taking the first table as an example, which contains all the candidate code words having even parity with an assumed initial NRZ bit of either '−1' or '+1', in the table, the total numbers of candidate code words in the candidate code word sets $\check{C}_{0000}$, $\check{C}_{0010}$, $\check{C}_{0001}$, $\check{C}_{1000}$, $\check{C}_{1010}$, $\check{C}_{1001}$, $\check{C}_{0100}$, $\check{C}_{0110}$, and $\check{C}_{0101}$ are illustrated in the third row of the second to tenth columns, respectively. The distribution of these candidate code words among the S=9 encoder states is respectively shown in the fourth to twelfth rows. As is mentioned above, states 1, 2, 3, and 4 are sub-states in the first state set, which includes candidate code words that start with '00'. States 5, 6 and 7 are sub-states in the second state set, which includes candidate code words that start either with one of '10', '01' and '00'. States 8 and 9 are sub-states in the third state set, which includes candidate code words that start either with '01' or '00'. The candidate code words are distributed according to the restrictions that the same candidate code word that end with a '00' (i.e. candidate code words in sets $\check{C}_{0000}$, $\check{C}_{0000}$ and $\check{C}_{0100}$) can be assigned to up to S=9 different user data words. The same candidate code word that end with a '10' (i.e. candidate code words in sets $\check{C}_{0010}$, $\check{C}_{1010}$, and $\check{C}_{0110}$) can only be assigned to up to $S_1+S_3=6$ different user data words. The same candidate code word that end with a '01' (i.e. candidate code words in sets $\check{C}_{0001}$, $\check{C}_{1001}$ and $\check{C}_{0101}$) can be only assigned to up to $S1=4$ different user data words. In addition, different states cannot contain the same candidate code word. For example, the set $\check{C}_{0000}$ has 70 candidate code words allocated in State 1, 71 candidate code words in states 2 and 3, 72 candidate code words in state 4, 8 candidate code words in state 7, and 3 candidate code words in state 9. The total number of used candidate code words is 70+71+71+72+8+3=295, which is smaller than 299, the total number of candidate code words in set $\check{C}_{0000}$. On the other hand, for state 1, the total number of assigned candidate code words is 70*9+32*6+51*4=1026, which is sufficient to map $2^{10}$=1024 user data words. Similarly, it can be verified that from any of the 9 encoder states, there are at least 1024 candidate code words that can be assigned to the user data words. This means that 10-bit user data words can be encoded. In the same manner, candidate code words having odd parity with an assumed initial NRZ bit of either '−1' or '+1' are distributed as shown in the second table in FIG. 13. This table also shows that 10-bit input data words can be supported. Following the tables shown in FIG. 13, a rate 10/20 (2,15) parity-related constrained code can be constructed.

Figure 14:
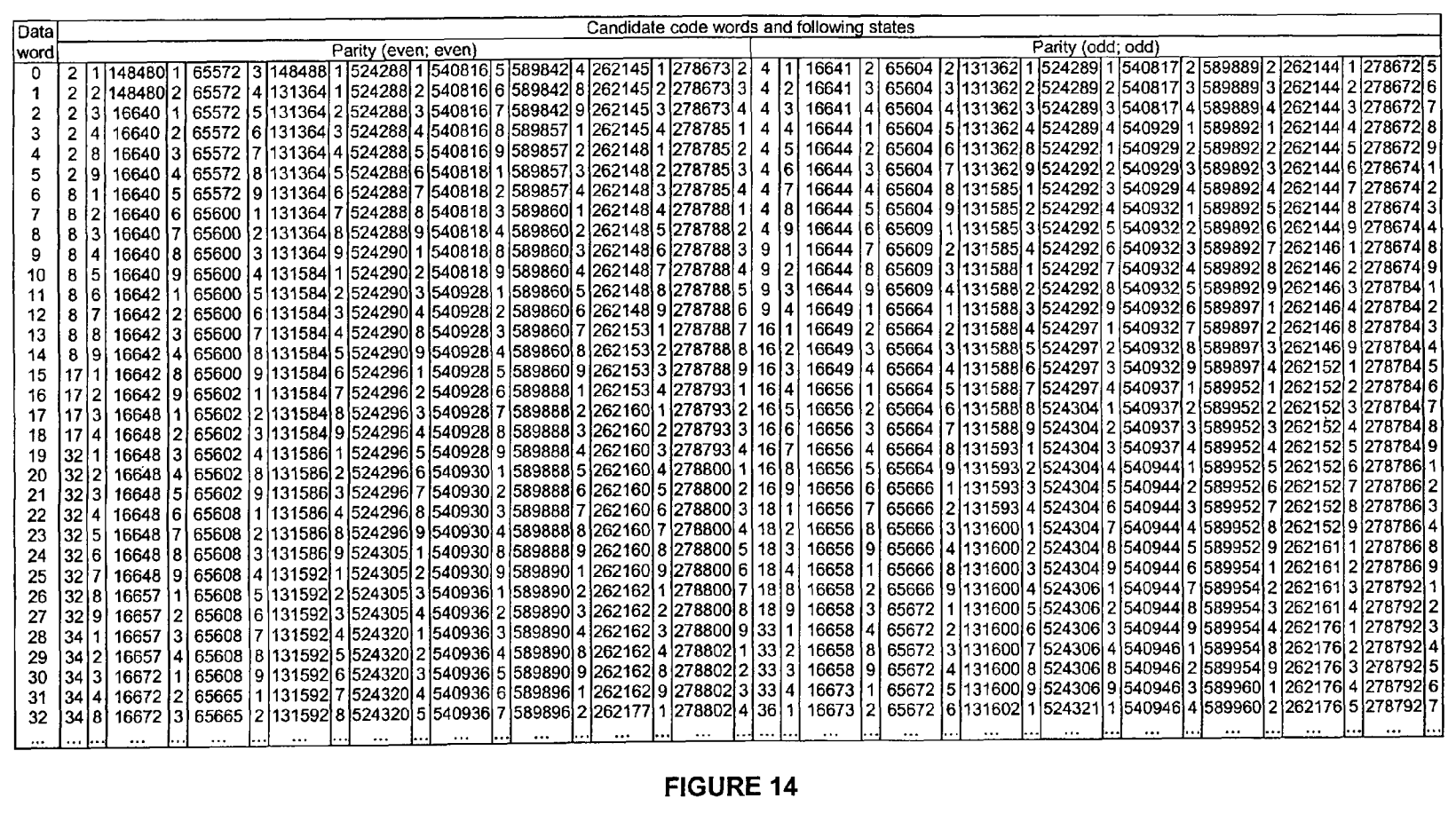

FIG. 14 shows the beginning portion of the code table for the rate 10/20 (2,15) parity-related constrained code. The first column is the decimal notation of the user data words. Elements in the second to nineteenth columns correspond to the decimal notation of the candidate code words having even parity with an assumed initial NRZ bit of either '−1' or '+1', and the associated following state information. In particular, the second, fourth, sixth, eighth, tenth, twelfth, fourteenth, sixteenth and eighteenth columns are the corresponding candidate code words mapped to the user data words in states 1 to 9, respectively. The third, fifth, seventh, ninth, eleventh, thirteenth, fifteenth, seventeenth and nineteenth columns are the following state information associated with candidate code words in the second, fourth, sixth, eighth, tenth, twelfth, fourteenth, sixteenth and eighteenth columns, respectively. In the same manner, candidate code words having odd parity with an assumed initial NRZ bit of either '−1' or '+1' and their associated following state information are shown in the twentieth to thirty-seventh columns.

Figure 15A:
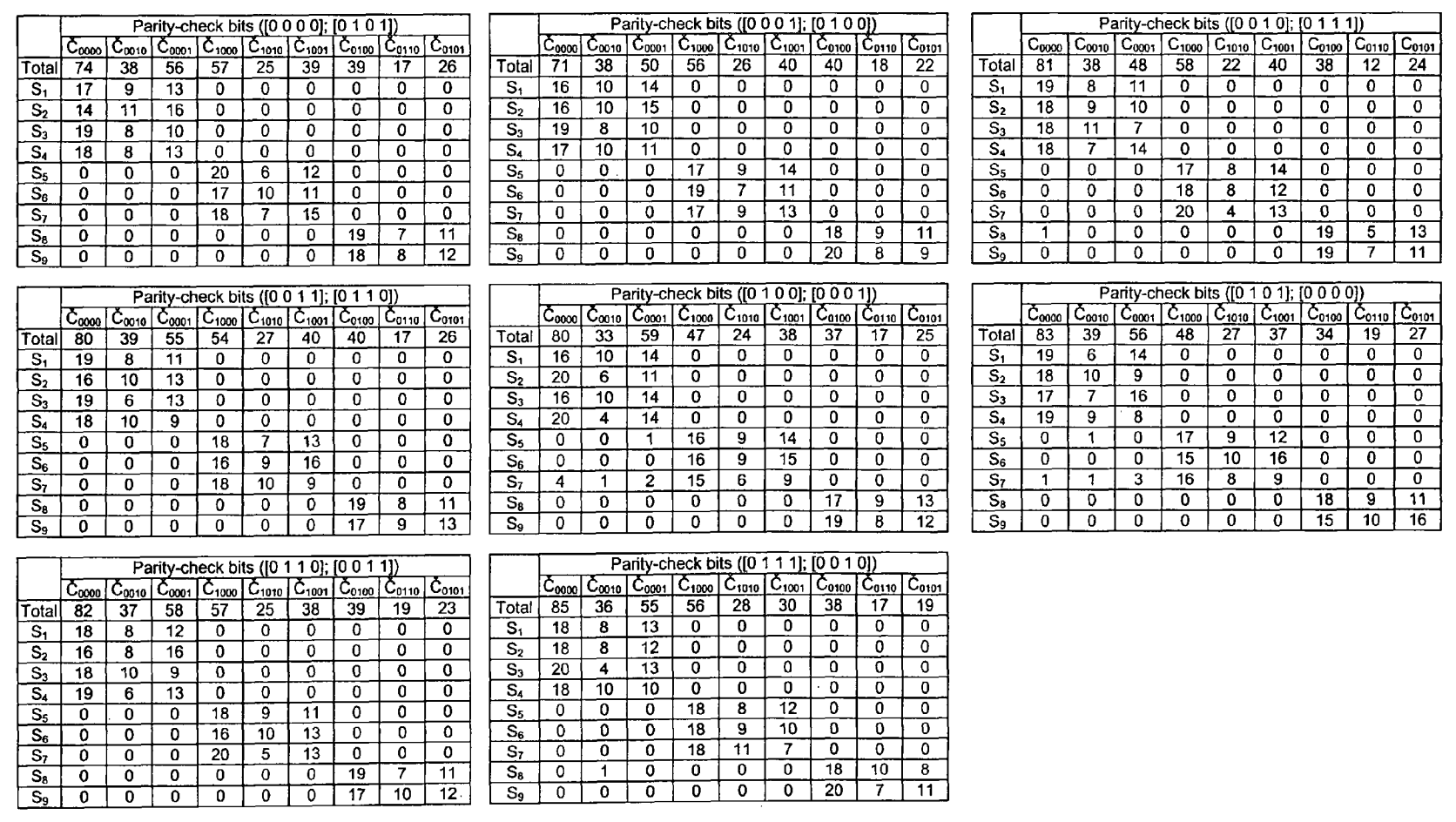
Figure 15B:
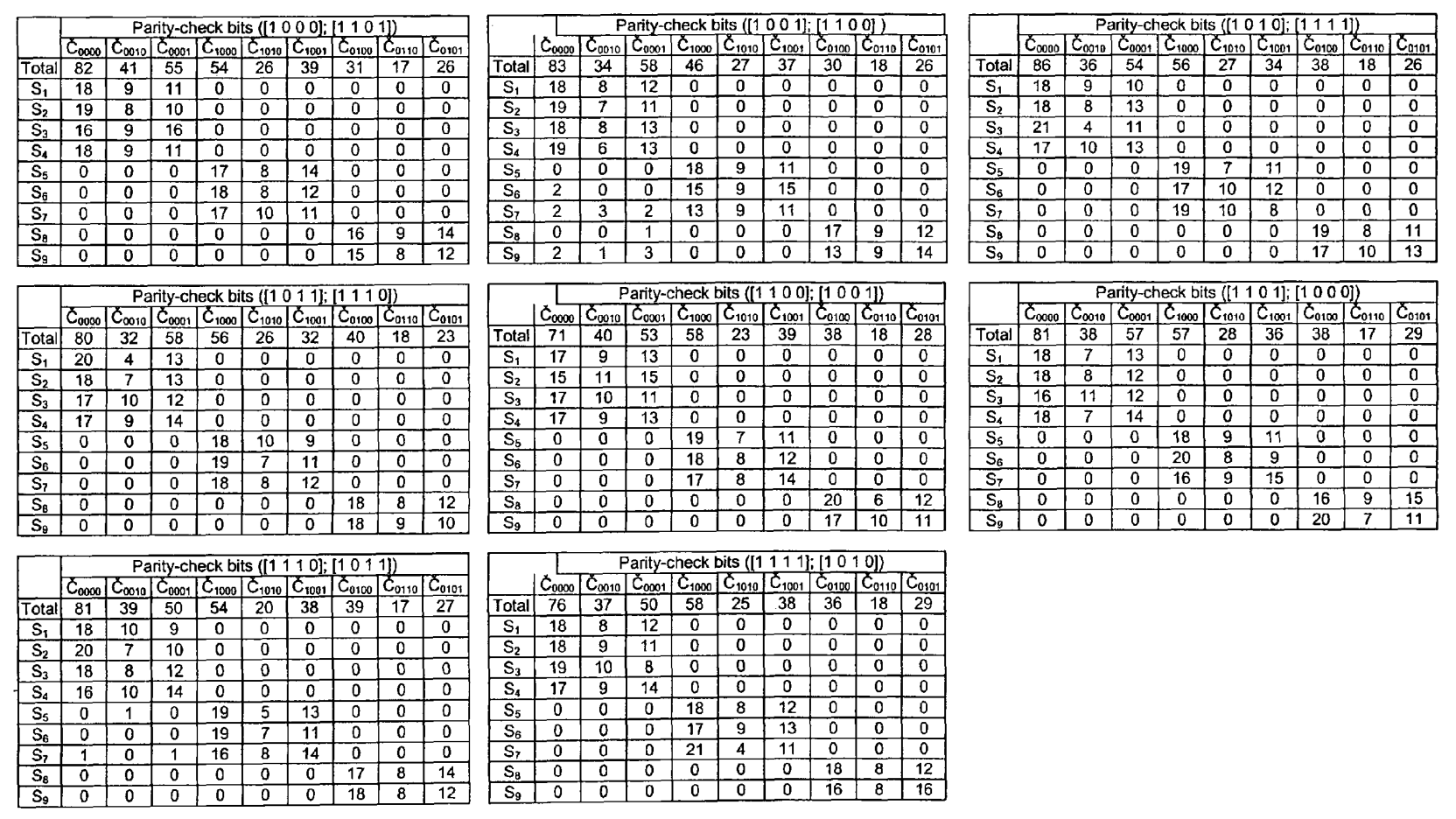

FIGS. 15A and 15B show the distribution of candidate code words in S=9 encoder states for the rate 8/22 (2,15) parity-related constrained code in the same fashion as FIG. 13. With a 4-bit parity-check, there are 16 distribution tables illustrated in FIGS. 15A and 15B, corresponding to the various parity-check bits of the candidate code words. In computing the parity-check bits of the candidate code words in the tables, it is assumed that the normal constrained coded sequence is un-shortened.

Figure 16A:
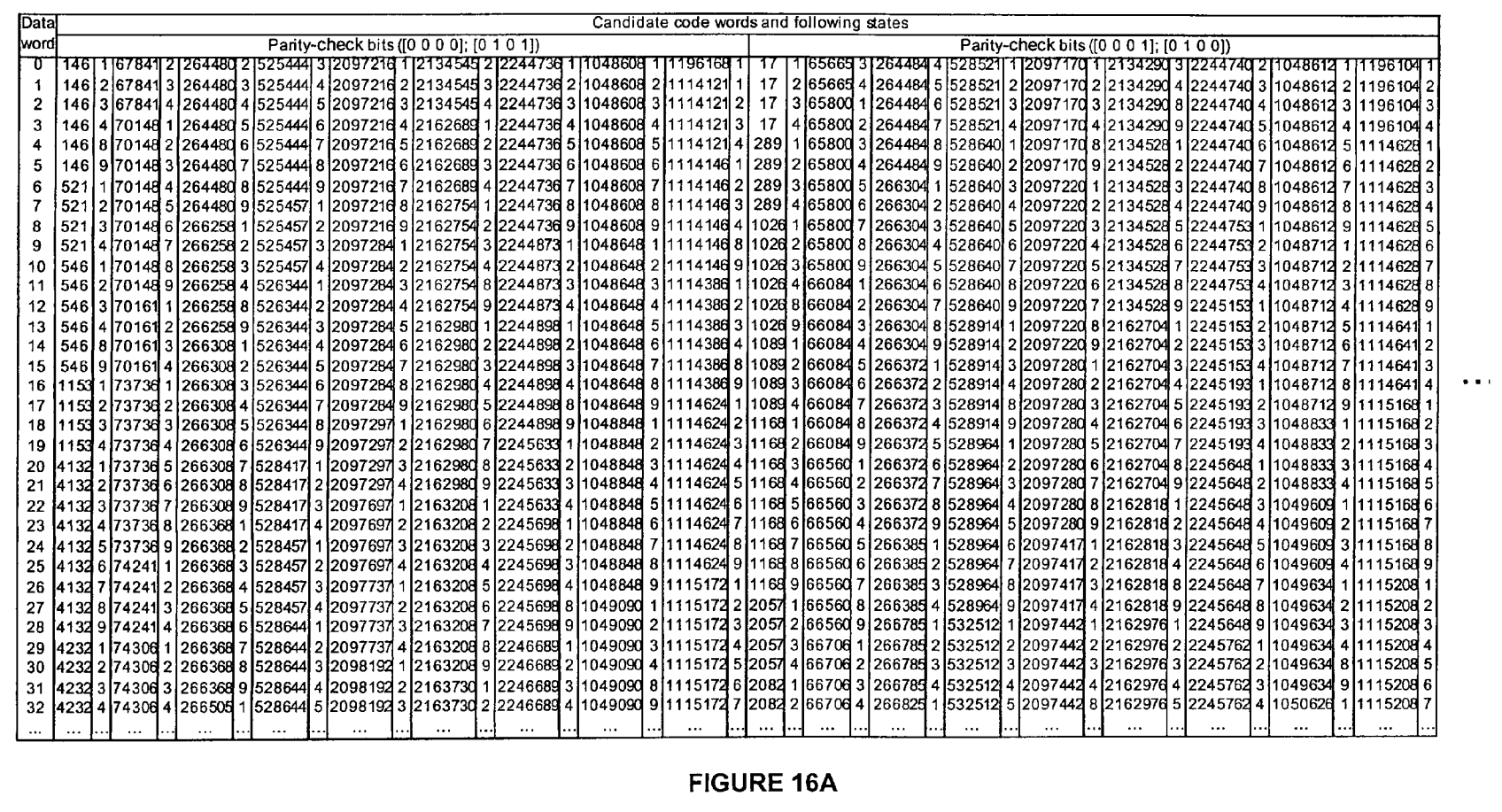
Figure 16B:
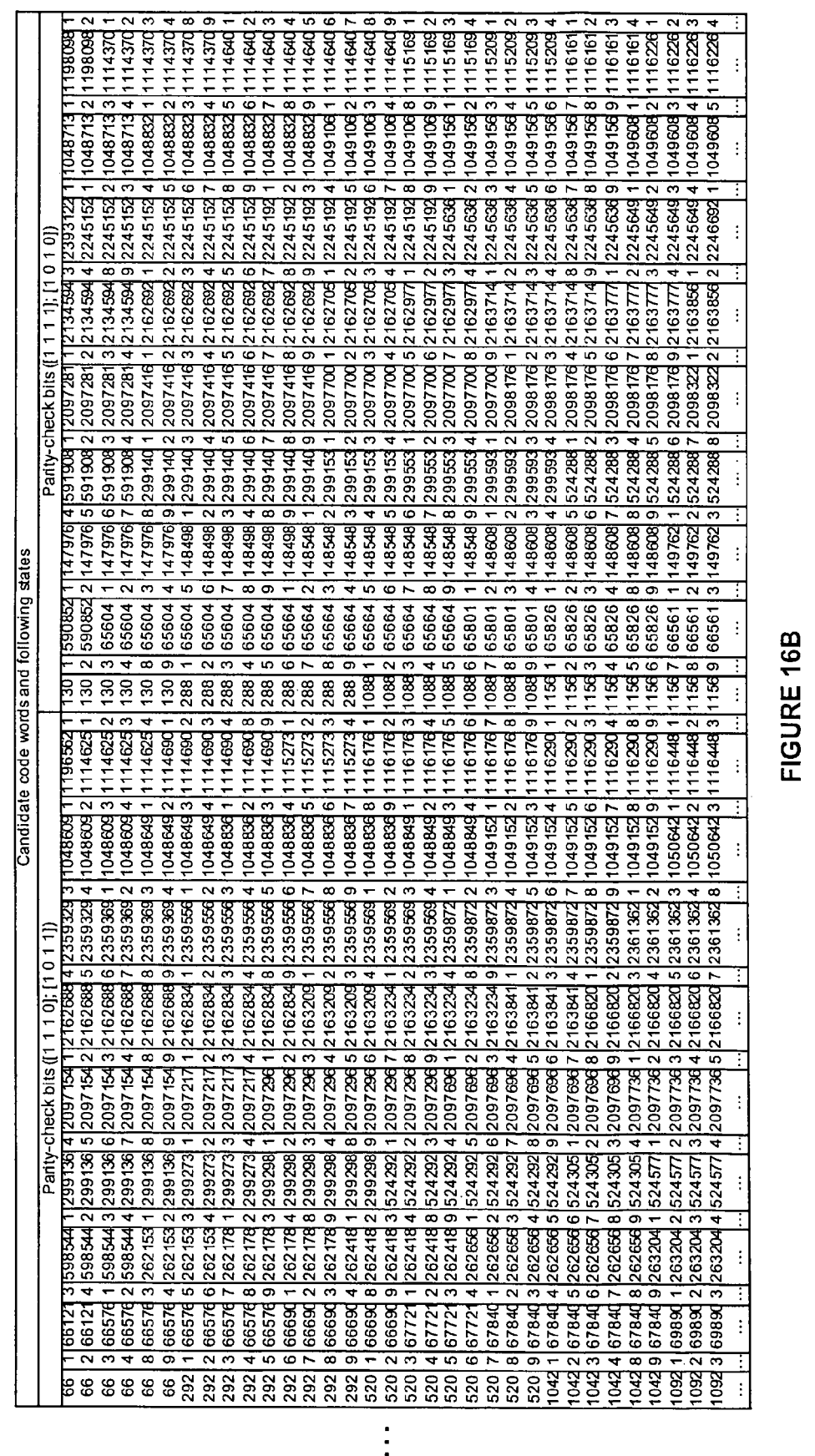

FIGS. 16A and 16B are examples from the beginning portion of the code table for the rate 8/22 (2,15) parity-related constrained code, in the same manner that FIG. 14 illustrated the code table for the 10/20 code. With a 4-bit parity-check, there are 16 groups of candidate code words sets with the same parity-check bits concatenated in the code table. FIGS. 16A and 16B illustrate the first two of these and the last two, respectively.

In the following, the performance of the newly designed codes is demonstrated using the recently introduced blu-ray-disc (BD) optical recording systems. Since the BD systems use d=1 codes, the new codes evaluated are the new d=1 constrained single-bit even parity-check code and the new d=1 constrained 4-bit parity-check code with the generation polynomial of $g(x)=1+x+x^4$. As is mentioned above, the two codes are made up of the concatenation of the rate 9/13 (1,18) normal constrained code with the rate 12/19 (1,18) parity-related constrained code and the rate 7/16 (1,18) parity-related constrained code, respectively. In particular, the performance of the newly designed codes is evaluated using computer simulations. In the simulations, it is assumed that the optical read-out is linear and the Braat-Hopkins model as discussed in G. Bouwhuis, J. Braat, A. Huijser, J. Pasman, G. van Rosmalen and K. A. Schouhamer Immink, Principles of Optical Disc Systems, Adam Hilger Ltd, Bristol, UK, 1985, is used to describe the channel. Thus, the Fourier transform of the channel symbol response is expressed as $$H(\Omega) = \begin{cases} \frac{2RT_u \sin(\pi\Omega)}{\pi^2 \Omega} \left[\arccos\left(\left|\frac{\Omega}{R\Omega_u}\right|\right)\right] - \left|\frac{\Omega}{R\Omega_u}\right| \sqrt{1 - \left(\frac{\Omega}{R\Omega_u}\right)^2} & \text{for } \left|\frac{\Omega}{R\Omega_u}\right| < 1, \\ 0 & \text{for } \left|\frac{\Omega}{R\Omega_u}\right| \geq 1, \end{cases} \quad (12)$$

where $\Omega$ is the frequency normalised by the channel bit rate, and R is the rate of the d=1 constrained parity-check code. The quantity $\Omega_u = f_c T_u$, where $f_c$ is the optical cut-off frequency, and $T_u$ is the duration of one user bit, is a measure of the recording density. The smaller $\Omega_u$ is, the higher is the recording density, and vice versa. For an optical recording system using a laser diode with wavelength $\lambda$ and a lens with numerical aperture NA, the normalised cut-off frequency is given $\Omega_u$=2 NA $L_u/\lambda$, where $L_u$ is the spatial length of one user bit. For BD systems using the rate 2/3 (1,7) code, with $\lambda$=405 nm, NA=0.85 and $L_u$=112.5 nm, $\Omega_u \approx$0.5.

In the following, cut-off frequencies $\Omega_u$=0.5 and $\Omega_u$=0.375 have been considered. These choices represent recording systems with nominal density and high density, respectively, according to current standards.

During data recovery, after pre-processing and partial response (PR) equalization, the sampled sequence is supplied to a channel detector such as a Viterbi detector. In the performance evaluations, a Viterbi detector that is matched to a 7-tap optimized channel PR target is used as the channel detector, whose performance is very close to that of the maximum likelihood sequence detection (MLSD) (see K. Cai, V. Y. Krachkovsky, and J. W. M. Bergmans, "Performance bounds for parity coded optical recording channels with d=1 constraint", Proc. of IEEE International Conference on Communications (ICC), Alaska, USA, May 2003.). The channel noise before equalization is assumed to be Gaussian and white. The dominant error events at the Viterbi detector output turn out to be $\pm\{2\}$, $\pm\{2, 0, -2\}\pm\{2, 0, -2,0,2\}$, and $\pm\{2, 0, -2, 0, 2, 0, -2\}$. The error event is the difference between the transmitted data sequence and the detected data sequence at the channel detector output. After the Viterbi detector, a post-processor is adopted for error correction. It can correct both single and double error events that occur within each detected constrained parity-check code word, by using the parity-check result of the detected code word at the output of the Viterbi detector, as well as the channel side information obtained at the input of the Viterbi detector.

Figure 17:
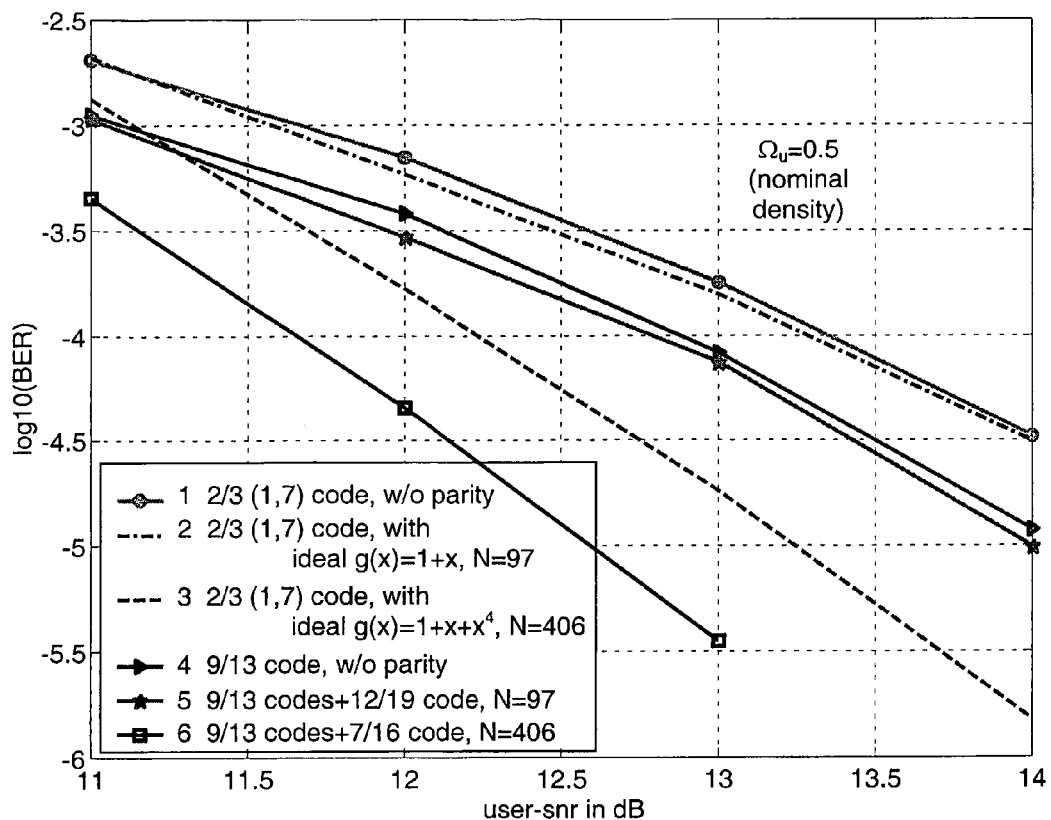
FIG. 17 shows a bit error rate (BER) performance comparison of parity-check coded BD systems with a prior art rate 2/3 (1,7) code and with the newly designed codes, at nominal density.
Figure 18:
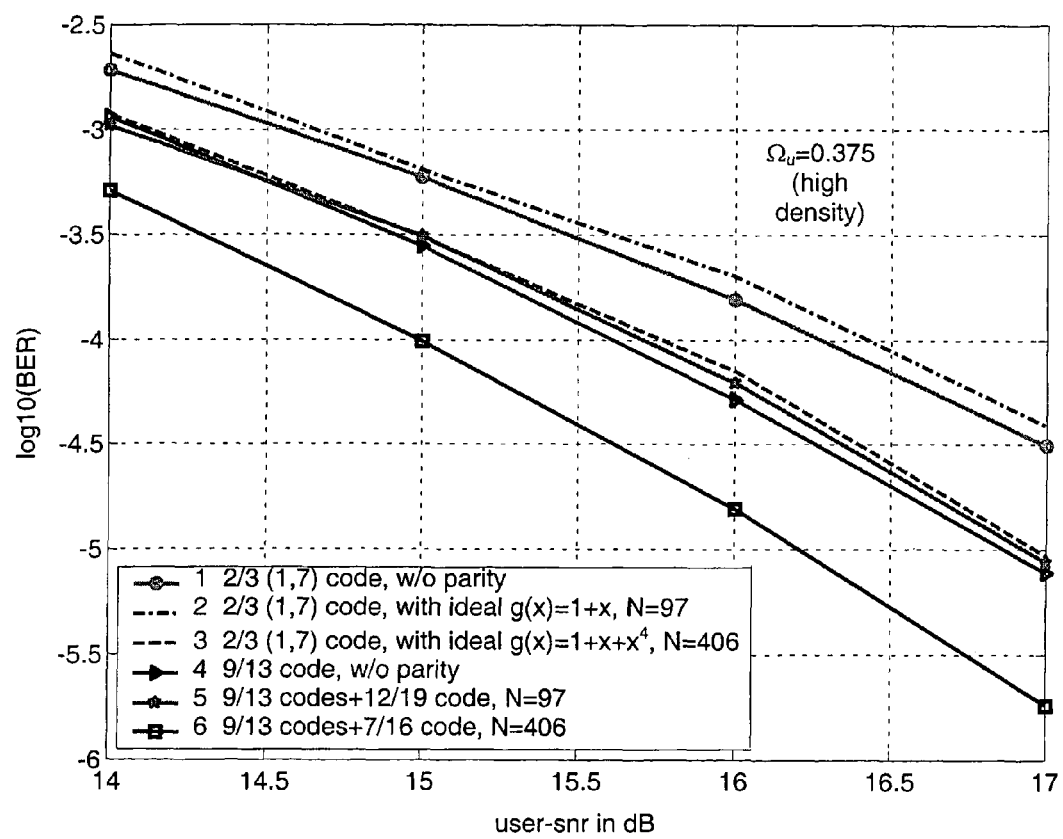
FIG. 18 shows a BER performance comparison of parity-check coded BD systems with the prior art rate 2/3 (1,7) code and with the newly designed codes, at high density.

FIGS. 17 and 18 illustrate the bit error rate (BER) performance comparison of the parity-check coded BD systems with the conventional rate 2/3 (1,7) code and with the newly designed codes, at nominal density and high density, respectively.

For the parity-check coded system with the rate 2/3 (1,7) code, the study does not include an explicit parity-check encoder embedded within the modulation encoder. This is because high efficiency parity-check codes with the d=1 constraint are not available according to the prior art coding schemes. Therefore, the parity-check codes are modelled by assuming that the parity-check for each detected code word is known at the detector side. This is done by generating a syndrome component for each detected code word in a 'data-aided' mode. By assuming that each parity-check bit requires the minimum overhead of one user bit, and an equivalent 1.5 channel bits, the corresponding rate of the code is R=2/3−p/N. The corresponding codes are thereby referred to as the ideal constrained parity-check codes.

In FIGS. 17 and 18, Curves 1 to 3 respectively indicate the performance of the rate 2/3 code without parity-check, with ideal single-bit event parity-check, and with ideal 4-bit parity-check defined by the generation polynomial of $g(x)=1+x+x^4$. Correspondingly, the performance of the rate 9/13 (1,18) code without parity-check is illustrated by Curve 4. The performances of the new constrained single-bit even parity-check code and the new constrained 4-bit parity-check code are illustrated by Curves 5 and 6, respectively.

The code word length of both the single-bit even parity-check codes is chosen to be 97, since it achieves a trade-off between code rate loss due to parity-check and error correction power of the post-processor. The overall code rate of the new constrained single-bit event parity-check code, according to equation (1), is thus 0.6804. Compared with the conventional rate 2/3 (1,7) code with ideal even parity-check, the rate of the new single-bit parity-check code is 3.66% higher. Furthermore, it is only 0.69% below the capacity of the parity-check codes with the d=1 constraint. Note that the capacity of parity-check codes with d=1 constraint is given by $R_c=R_{c(1,\infty)}-p|N$, where $R_{c(1,\infty)}=0.6942$, is the capacity of (d=1, k=∞) codes. With a code word length of 406 for the new constrained 4-bit parity-check, the code rate is 0.6823. It is 3.88% higher than that of the rate 2/3 (1,7) code with ideal 4-bit parity-check, and is only 0.41% below the capacity of the parity-check codes with d=1 constraint.

Comparison between Curves 1 to 2, and Curves 4 to 5 shows that as compared to the performance of the system without parity-check codes, no significant performance gain is found for the single-bit even parity-check codes, with both the rate 2/3 code and the rate 9/13 code. This is because both single-bit even parity-check codes cannot detect the dominant error event $\pm\{2, 0, -2\}$. Comparison between Curves 1 to 3, and Curves 4 to 6 shows that the 4-bit parity-check codes with generator polynomial $g(x)=1+x+x^4$ achieve much higher coding gains, with both the rate 2/3 code and the rate 9/13 code. The reason is that the 4-bit parity-check codes can detect all the dominant error events of the system and provide more side information to the post-processor.

It is further observed that the rate 9/13 code brings significant performance gain over the conventional rate 2/3 code, for both cases without and with the parity-check code, due to its higher code rate. At BER=$10^{-5}$, the new 4-bit constrained parity-check codes gain around 0.7 dB over the rate 2/3 code with ideal 4-bit parity-check at nominal density. At the high density, the performance improvement is around 1 dB. In general, compared to the case with the rate 2/3 code, and without parity-check, the new 4-bit constrained parity-check code achieves a performance gain of 2 dB at nominal density, and 1.5 dB gain at high density.

The above-described exemplary embodiments are able to encode a segment of user data into a segment of channel code words so that both modulation constraints and a predetermined parity-check constraint are satisfied. Each segment of the user data is partitioned into several data words, and encoded separately by first and second types of component code, which are referred to as the normal constrained code and the parity-related constrained code, respectively. The parity-check constraint over the combined code word is achieved by concatenating the sequence of normal constrained code words with a specific parity-related constrained code word chosen from a candidate code word set. Both the component codes are finite-state constrained codes, which are designed to have the rates close to the Shannon capacity. Furthermore, they are based on the same FSM, which enables them to be connected seamlessly, without violating the modulation constraints. Two preferred embodiments are provided to design the code in the NRZI format and the NRZ format, respectively. Designing the codes in NRZ format may reduce the number of parity-check bits required for error detection and simplify error correction or post-processing. The parity-check constraint is defined by the parity-check polynomial or parity-check matrix of a systematic linear block code, which could detect any type of dominant error event as well as error events combinations of a given optical recording system. As a result, the information density of the system is improved.

The encoders and decoders described above may be implemented using just hardware, with circuits dedicated for the required processing, or by a combination of hardware and software modules.

A module, and in particular the module's functionality, can be implemented in either hardware or software. In the software sense, a module is a process, program, or portion thereof, that usually performs a particular function or related functions. In the hardware sense, a module is a functional hardware unit designed for use with other components or modules. For example, a module may be implemented using discrete electronic components, or it can form a portion of an entire electronic circuit such as an Application Specific Integrated Circuit (ASIC). Numerous other possibilities exist.

While the preferred embodiments of the invention have been described in detail above, it will be understood that various new constrained parity-check codes fitting to different data storage systems can be designed by those skilled in the art based on the techniques described herein.

While the invention has been particularly shown and described with reference to the preferred embodiments, it will be understood by those skilled in the art that various changes and modifications in form and detail may be made therein without departing from the spirit and scope of the invention.

The invention claimed is:

1. A method of encoding data from a data source, an input segment of user data from the data having been partitioned into data words, the method implemented by an encoder and comprising:
   encoding the data words into one or more first component code words and a second component code word; and
   concatenating the one or more first component code words with the second component code word to provide a combined code word, with a pre-determined parity-check constraint over the entire combined code word, the parity-check constraint being defined by a parity-check polynomial or a parity-check matrix of a systematic linear block code;
   wherein the one or more first component code words comprise one or more code words of a normal constrained code and the second component code word comprises a code word of a parity-related constrained code, and
   wherein the parity-related constrained code is selected from a candidate code word set.

2. The method of claim 1, wherein concatenating the one or more first component code words and the second component code word achieves a pre-determined parity-check constraint over the combined code word.

3. The method of claim 1, wherein both the normal constrained code and the parity-related constrained code are finite-state codes of fixed length.

4. The method of claim 1, wherein the normal constrained code and the parity-related constrained code have code rates approaching the Shannon capacity.

5. The method of claim 1, wherein one data word is encoded to one constrained code word only.

6. The method of claim 1, wherein various parity-check bits of the parity-related constrained code word correspond to a predefined parity-check polynomial or parity-check matrix.

7. The method of claim 1, wherein the normal constrained code is designed using a finite state machine (FSM).

8. The method of claim 7, wherein the design of the normal constrained code is based on an efficient FSM to satisfy modulation constraints.

9. The method of claim 1, wherein the one or more first component code words are selected from a code table of a normal constrained code comprising one set of normal constrained code words.

10. The method of claim 1, wherein the normal constrained code is designed using a finite state machine (FSM), and wherein the set of candidate code words of the parity-related constrained code with various parity-check bits is designed based on the same FSM as the normal constrained codes.

11. The method of claim 1, further comprising designing the parity-related constrained code, comprising:
    (i) designing candidate code words of the parity-related constrained code;
    (ii) computing the parity-check bits of the candidate code words;
    (iii) distributing the candidate code words into a group of code word sets; and
    (iv) concatenating the code word sets together, and
    (v) forming a code table for at least one of encoding and decoding of the parity-related constrained code.

12. The method of claim 1, wherein the one or more normal constrained code words comprise a plurality of normal constrained code words, the method further comprising concatenating the plurality of normal constrained code words into a normal constrained code words sequence.

13. The method of claim 12, wherein concatenating the one or more first component code words with the second component code word to provide the combined code word comprises appending the parity-related constrained code word to the end of the normal constrained code words sequence, to impose the parity-check constraint over the combined code word.

14. The method of claim 1, wherein the second component code word is encoded by:
    calculating parity-check bits of the one or more normal constrained code words; and
    choosing a candidate code word of the parity-related constrained code that has the same parity-check bits as the calculated parity-check bits.

15. The method of claim 14, wherein choosing the candidate code word is based on the calculated parity-check bits.

16. The method of claim 14, wherein choosing the candidate code word is based on state information indicating the next state from which to select a candidate code word.

17. The method of claim 1, wherein the encoding data words into the one or more first component code words comprises encoding each such data word based on state information indicating the next state from which to select a normal constrained code word from a code table of the normal constrained code.

18. The method of claim 1, wherein the normal constrained code and the parity-related constrained code are in NRZI format.

19. The method of claim 1, wherein the one or more code words of the normal constrained code and the parity-related constrained code are in NRZ format.

20. The method of claim 19, wherein encoding the data words into the one or more first component code words further comprises precoding the normal constrained code words into the NRZ format.

21. The method of claim 20, wherein the one or more normal constrained code words comprise a plurality of normal constrained code words, the method further comprising concatenating the plurality of normal constrained code words into a normal constrained code words sequence, wherein the plurality of normal constrained code words are precoded prior to concatenating the plurality of normal constrained code words into the normal constrained code words sequence.

22. The method of claim 20, wherein the second component code word is encoded by calculating parity-check bits of the one or more normal constrained code words and choosing a candidate code word of the parity-related constrained code that has the same parity-check bits as the calculated parity-check bits, and wherein the one or more normal constrained code words are precoded prior to calculating the parity-check bits.

23. The method of claim 20, wherein the second component code word is encoded by calculating parity-check bits of the one or more normal constrained code words and choosing a candidate code word of the parity-related constrained code that has the same parity-check bits as the calculated parity-check bits, and wherein choosing the candidate code word of the parity-related constrained code is further based on the last precoded normal constrained code word.

24. The method of claim 23, wherein choosing the candidate code word of the parity-related constrained code is based on the last bit of the last precoded normal constrained code word.

25. The method of claim 19, wherein encoding a data word into the second component code word comprises precoding the parity-related constrained code word prior to concatenating the one or more first component code words and second component code words.

26. The method of claim 19, wherein the second component code word is selected from a code table of the parity-related constrained code comprising a plurality of sets of candidate code words,
wherein the candidate code words of the parity-related constrained code are in the NRZI format, and
wherein parity-check bits of the candidate code words are computed in the NRZ domain, based on an assumed initial NRZ bit.

27. The method of claim 1 further comprising using the parity-check polynomial or parity-check matrix of the systematic linear block code to detect dominant error events or dominant error event combinations of a system.

28. The method of claim 27, wherein the detected error events detected by designed codes comprise any of: (a) any type of dominant error event and (b) error event combinations of any given system.

29. The method of claim 1, wherein the combined code word has a modulation constraint of one of: (a) d=1 and (b) d=2.

30. The method of claim 1, further comprising encoding the data for an optical recording medium.

31. The method of claim 30, wherein the optical recording medium is selected from the group consisting of: CD, DVD, BD, AOD, high-density BD, and high-density AOD.

32. The method according to claim 1, wherein the parity-check constraint includes a rate R which is derived from:

$$R=R_n-(n/N)(R_n-R_p),$$

wherein:
$R_n$ is rate of the normal constrained code,
n is length of the parity-related constrained code,
N is length of the combined code word, and
$R_p$ is rate of the parity-related constrained code.

33. A computer-implemented method of designing a parity-related constrained code for use with a sequence of normal constrained code words, the method comprising:
(i) designing candidate code words of the parity-related constrained code using a finite state machine (FSM);
(ii) computing parity-check bits of the candidate code words based on a given parity-check polynomial or parity-check matrix, and taking into account the length of a sequence comprising the normal constrained code words;
(iii) distributing the candidate code words into a group of code word sets;
(iv) concatenating the code word sets together; and
(v) forming a code table for at least one of encoding and decoding of the parity-related constrained code;
(vi) releasing a run-length constraint k prior to designing the candidate code words, and
(vii) tightening the run-length constraint k by optimizing the code table through at least one of: (a) deleting candidate code words that start or end with long runs of 0's, and (b) increasing the number of states in the FSM.

34. The method of claim 33, wherein the candidate code words are distributed into different sets according to their parity-check bits.

35. The method of claim 33, wherein the normal constrained code is designed using an FSM and wherein the candidate code words of the parity-related constrained code are designed using the same FSM as the normal constrained codes.

36. The method of claim 35, wherein the candidate code words are designed using the same FSM to achieve a capacity approaching code rate.

37. The method of claim 33, wherein the normal constrained code is designed using an FSM and wherein, in each state of the FSM of the parity-related constrained code, there is a total of $2^p$ candidate code words potentially mapped to one data word, where p is the number of parity-check bits.

38. The method of claim 33, wherein the candidate code words are distributed into a group of $2^p$ code word sets, where p is the number of parity-check bits.

39. The method of claim 33, further comprising:
forming a code table for the parity-related constrained codes; wherein
the code table designed for the parity-related constrained code is larger than a code table for the normal constrained code by a factor of $2^p$, where p is the number of parity-check bits.

40. The method of claim 33, wherein, for the same length of user data word, the length of the parity-related constrained code word is longer than that of the normal constrained code word.

41. An encoding apparatus for encoding user data from a data source, where an input segment of the user data has been partitioned into data words, the apparatus comprising:
first encoder means for encoding one or more of the data words into one or more first component code words;
second encoder means for encoding a data word into a second component code word; and
concatenator means for concatenating the one or more first component code words with the second component code word to provide a combined code word, with a predetermined parity-check constraint over the entire combined code word, the parity-check constraint defined by a parity-check polynomial or a parity-check matrix of a systematic linear block code;
wherein the one or more first component code words comprise one or more normal constrained code words of a normal constrained code and the second component code word comprises a code word of a parity-related constrained code, and
wherein the parity-related constrained code is selected from a candidate code word set.

42. The apparatus of claim 41, further comprising a normal constrained code table comprising a plurality of normal constrained code words from which an output of the normal constrained code is selected.

43. The apparatus of claim 41, further comprising a parity-related constrained code table comprising a plurality of candidate code words of a parity-related constrained code from which an output of the parity-related constrained code is selected.

44. The apparatus of claim 41, further comprising partitioning means for the partitioning of the input segment of the user data into the data words.

45. The apparatus of claim 41, further comprising parity-check means for calculating parity-check bits of the sequence of one or more normal constrained code words.

46. The apparatus of claim 45, wherein the second encoder means is operable to receive the calculated parity-check bits from the parity-check means and output the parity-related constrained code word based on the calculated parity-check bits.

47. The apparatus of claim 41, wherein the first encoder means is operable to encode all but one of the data words of the input segment of the user data and the second encoder means is operable to encode the remaining data word.

48. The apparatus of claim 47, wherein the remaining data word is the last data word of the input segment of the user data.

49. The apparatus of claim 41, wherein the second encoder means comprises a parity-related constrained encoder.

50. The apparatus of claim 41, wherein the first encoder means comprises a plurality of normal constrained encoders.

51. The apparatus of claim 50, wherein the encoders of the first encoder means are provided in a sequence and individual encoders of the first encoder means are arranged to receive following state information passed from the respective previous encoder in the sequence of encoders indicating an encoder state from which to assign a code word for the respective current data word.

52. The apparatus of claim 41, wherein the second encoder means is arranged to receive following state information passed from the first encoder means indicating an encoder state from which to select a candidate code word of the parity-related constrained code for encoding the current data word.

53. The apparatus of claim 52, wherein the second encoder means is further arranged to output the following state information to the first encoder means for encoding a second segment of user data from the data source, the second segment immediately following the input segment.

54. The apparatus of claim 53, wherein a first encoder of a sequence of encoders of the first encoder means is arranged to receive the following state information output from the second encoder means for a third segment of user data from the data source, the third segment immediately preceding the input segment.

55. The apparatus of claim 41, further comprising first precoder means for precoding the one or more normal constrained code words prior to concatenation by the concatenator means.

56. The apparatus of claim 55, wherein the second encoder means is further operable to receive at least a portion of, or one of, the precoded normal constrained code words from the first precoder means and select the parity-related constrained code from the candidate code word set based further on the at least a portion of, or one of, the precoded normal constrained code words.

57. The apparatus of claim 56, wherein the at least a portion of, or one of, the precoded normal constrained code words comprises the last bit from the at least a portion of, or one of, the precoded normal constrained code words.

58. The apparatus of claim 56, wherein the first encoder means is operable to produce a plurality of first component code words and the at least a portion of one of the precoded normal constrained code words comprises at least a portion of the last precoded normal constrained code word.

59. The apparatus of claim 41, further comprising second precoder means for precoding the selected parity-related constrained code word prior to concatenation by the concatenator means.

60. An encoder for encoding user data from a data source, where an input segment of user data has been partitioned into data words, the encoder comprising:
a plurality of first encoders for encoding the data words into first component code words;
a second encoder for encoding a data word into a second component code word; and
a concatenator for concatenating the first component code words with the second component code word to provide a combined code word, with a pre-determined parity-check constraint over the entire combined code word, the parity-check constraint being defined by a parity-check polynomial or a parity-check matrix of a systematic linear block code;
wherein the first component code words comprise normal constrained code words of a normal constrained code and the second component code word comprises a p code word of a parity-related constrained code, the parity-related constrained code being selected from a candidate code word set.

61. Memory means storing therein data encoded by the encoder of claim 60.

62. The memory means of claim 61, wherein the memory means is an optical recording medium.

63. A method of decoding a constrained parity-check code word into a segment of user data, the constrained parity-check code word comprising a concatenation of first component code words and a second component code word, the method implemented by a decoder and comprising:
decoding a plurality of first component code words and the second component code word into a plurality of user data words; and
combining state information indicated by the next code word with the knowledge of the current code word, the decoder uniquely determining the data words associated with the current code words,
wherein the first component code words comprise normal constrained code words and the second component code word comprises a parity-related constrained code word, and
wherein decoding the second component code word is based on the state information indicated by the next code word.

64. The method of claim 63, further comprising separating the constrained parity-check code word into the plurality of first component code words and the second component code word prior to decoding.

65. The method of claim 63, further comprising concatenating the plurality of user data words output from a plurality of decoders for decoding the first component code words and the decoder for decoding the second component code word.

66. The method of claim 63, further comprising inverse precoding the first component code words and the second component code word prior to decoding.

67. The method of claim 66, wherein the inverse precoding the first component code words and the second component code word converts the component code words from NRZ format to NRZI format.

68. The method of claim 63, wherein the component code words are in NRZ format.

69. The method of claim 63, wherein decoding the first component code words comprises decoding individual first component code words based on state information indicated by the next code word.

70. The method of claim 63, further comprising decoding a code word encoded by the method of claim 1.

71. The method of claim 63, further comprising decoding data from an optical recording medium.

72. A decoder apparatus for decoding a constrained parity-check code word into a segment of user data, the code word comprising a concatenation of first component code words and a second component code word, the apparatus comprising:
first decoder means for decoding the plurality of first component code words into a plurality of user data words;
second decoder means for decoding the second component code word into a user data word; and means for combining the state information indicated by the next code word with knowledge of the current code word, the first and second decoder means uniquely determining the data words associated with the current code words, wherein the first component code words comprise normal constrained code words and the second component code word comprises a parity-related constrained code word, wherein the second decoder means is operable to decode the second component code word based on state information indicated by the next code word.

73. The apparatus of claim 72, further comprising separating means for separating the code word into the first component code words and the second component code word prior to decoding.

74. The apparatus of claim 72, further comprising concatenating means for concatenating the plurality of user data words output from the first decoder means and the second decoder means.

75. The apparatus of claim 72, further comprising inverse precoder means for inverse precoding the first component code words and the second component code word prior to decoding by the first decoder means and the second decoder means.

76. The apparatus of claim 75, wherein the inverse precoder is operable to convert the first component code words and the second component code word from NRZ format to NRZI format.

77. The apparatus of claim 72, wherein the first decoder means is operable to decode the first component code words by decoding individual first component code words based on state information indicated by the next code word.

78. The apparatus of claim 72, wherein the first decoder means comprises a plurality of normal constrained decoders.

79. The apparatus of claim 72, wherein the second decoder means comprises a parity-related constrained decoder.

80. The apparatus of claim 72, wherein the apparatus is operable to decode a code word encoded by the method of claim 1.

81. The apparatus of claim 72, wherein the apparatus is operable to decode data from an optical recording medium.

* * * * *